US012237438B2

United States Patent
Liu et al.

(10) Patent No.: US 12,237,438 B2
(45) Date of Patent: Feb. 25, 2025

(54) LIGHT-EMITTING DEVICE, LIGHT-EMITTING MODULE INCLUDING THE SAME AND DISPLAY APPARATUS INCLUDING THE SAME

(71) Applicant: XIAMEN SAN'AN OPTOELECTRONICS CO., LTD., Tong'an District (CN)

(72) Inventors: Shiwei Liu, Tong'an District (CN); Jin Xu, Tong'an District (CN); Shuijie Wang, Tong'an District (CN); Zhenni Que, Tong'an District (CN); Ke Liu, Tong'an District (CN); Chung-Ying Chang, Tong'an District (CN); Ho-Chia Tseng, Tong'an District (CN)

(73) Assignee: XIAMEN SAN'AN OPTOELECTRONICS CO., LTD., Fujian Province (CN)

( * ) Notice: Subject to any disclaimer, the term of this patent is extended or adjusted under 35 U.S.C. 154(b) by 601 days.

(21) Appl. No.: 17/454,895

(22) Filed: Nov. 15, 2021

(65) Prior Publication Data
US 2022/0158028 A1 May 19, 2022

(30) Foreign Application Priority Data

Nov. 16, 2020 (CN) .......................... 202011280926.2
Nov. 16, 2020 (CN) .......................... 202011282176.2

(51) Int. Cl.
*H01L 33/14* (2010.01)
*H01L 27/15* (2006.01)
(Continued)

(52) U.S. Cl.
CPC .......... *H01L 33/145* (2013.01); *H01L 27/156* (2013.01); *H01L 33/20* (2013.01); *H01L 33/46* (2013.01); *H01L 33/62* (2013.01)

(58) Field of Classification Search
CPC ....... H01L 33/145; H01L 33/20; H01L 33/46; H01L 33/62; H01L 33/22; H01L 27/156; H01L 27/15
See application file for complete search history.

(56) References Cited

U.S. PATENT DOCUMENTS

2021/0036049 A1* 2/2021 Wang ..................... H01L 33/44

FOREIGN PATENT DOCUMENTS

| CN | 109728143 A | 5/2019 |
|---|---|---|
| CN | 111129256 A | 5/2020 |
| CN | 112164742 A | 1/2021 |

OTHER PUBLICATIONS

Search Report appended to Office Action, which was issued to Chinese counterpart application No. 202011280926.2 by the CNIPA on Aug. 2, 2021 with English translations thereof.
(Continued)

*Primary Examiner* — Amar Movva
*Assistant Examiner* — Sandra Milena Rodriguez Villan
(74) *Attorney, Agent, or Firm* — Thomas| Horstemeyer, LLP

(57) ABSTRACT

A light-emitting device includes a substrate, a first and second mesa structures disposed on the substrate, at least one current blocking element, at least one conductive bridging element, and first and second conductive pads. The conductive bridging element is disposed on the current blocking element, and is electrically connected to the first and second mesa structures. The first and second conductive pads are electrically connected to the first and second mesa structures, respectively. The conductive bridging element has a projection image that is spaced apart from those of the first and second conductive pads in a plan view of the light-emitting device. A light-emitting module including the
(Continued)

light-emitting device, and a display apparatus including the light-emitting device are also disclosed.

18 Claims, 16 Drawing Sheets

(51) Int. Cl.
  *H01L 33/20* (2010.01)
  *H01L 33/46* (2010.01)
  *H01L 33/62* (2010.01)

(56) References Cited

OTHER PUBLICATIONS

Search Report appended to Office Action, which was issued to Chinese counterpart application No. 202011282176.2 by the CNIPA on Aug. 2, 2021 with English translations thereof.

* cited by examiner

LIGHT-EMITTING DEVICE, LIGHT-EMITTING MODULE INCLUDING THE SAME AND DISPLAY APPARATUS INCLUDING THE SAME

CROSS-REFERENCE TO RELATED APPLICATION

This application claims priorities of Chinese Invention Patent Application No. 202011282176.2, filed or. Nov. 16, 2020, and Chinese invention Patent Application No. 202011280926.2, filed on Nov. 16, 2020.

FIELD

The disclosure relates to a semiconductor device, and more particularly to a light-emitting device with high reliability.

BACKGROUND

A light-emitting diode (LED) is widely used in various applications such as general lighting, visible light communication, display screens, etc., because the LED is advantageous in terms of high energy conversion efficiency, low production cost and less environmental concerns.

In comparison with a liquid-crystal display (LCD) or an organic light-emitting diode (OLED) display, the LED has a great potential to be used as a light source for third generation displays due to its advantages properties such as high brightness, low power consumption, long lifetime and small chip size to achieve a high pixel density.

In order to pursue an ultra-high display resolution, the LED is developed towards miniaturization of a chip size, so as to form an LED array with a pitch of millimeter scale or micrometer scale.

However, reliability issue of the LED exists during miniaturization of a chip size, thereby requiring optimization of a structure of the LED for improving its product reliability.

SUMMARY

Therefore, an object of the disclosure is to provide a light-emitting device that can alleviate or eliminate at least one of the drawbacks of the prior art.

According to one aspect of the disclosure, a light-emitting device includes a substrate, a first mesa structure, a second mesa structure, at least one current blocking element, at least one conductive bridging element, a first conductive pad, and a second conductive pad.

The first and second mesa structures are separately disposed on the substrate with a groove formed therebetween. The groove has a bottom. Each of the first and second mesa structures includes a first type semiconductor layer disposed on the substrate, an active layer disposed on the first type semiconductor layer to expose a portion of the first type semiconductor layer, and a second type semiconductor layer disposed on the active layer to expose the exposed portion of the first type semiconductor layer. The first type semiconductor layer, the active layer and the second type semiconductor layer cooperatively define a side surface.

The at least one current blocking element is disposed on the second type semiconductor layer of the first mesa structure to expose a portion of the second type semiconductor layer of the first mesa structure, and extends to the side surface of the first mesa structure, the bottom of the groove and a portion of the side surface of the second mesa structure defined by the first type semiconductor layer in a continuous manner.

The at least one conductive bridging element is disposed on the at least one current blocking element, and includes a body portion, a first portion extending from the body portion and electrically connected to the second type semiconductor layer of the first mesa structure, and a second portion extending from the body portion and electrically connected to the first type semiconductor layer of the second mesa structure.

The first conductive pad is located in corresponding position above the first mesa structure, and is electrically connected to the first type semiconductor layer of the first mesa structure.

The second conductive pad is located in corresponding position above the second mesa structure, and is electrically connected to the second type semiconductor layer of the second mesa structure.

The at least one conductive bridging element has a projection image that is spaced apart from those of the first and second conductive pads in a plan view of the light-emitting device.

According to another aspect of the disclosure, a light-emitting module includes the light-emitting device abovementioned.

According to yet another aspect of the disclosure, a display apparatus includes a backlighting module, and the light-emitting device abovementioned, which serves as a light source of the backlighting module.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
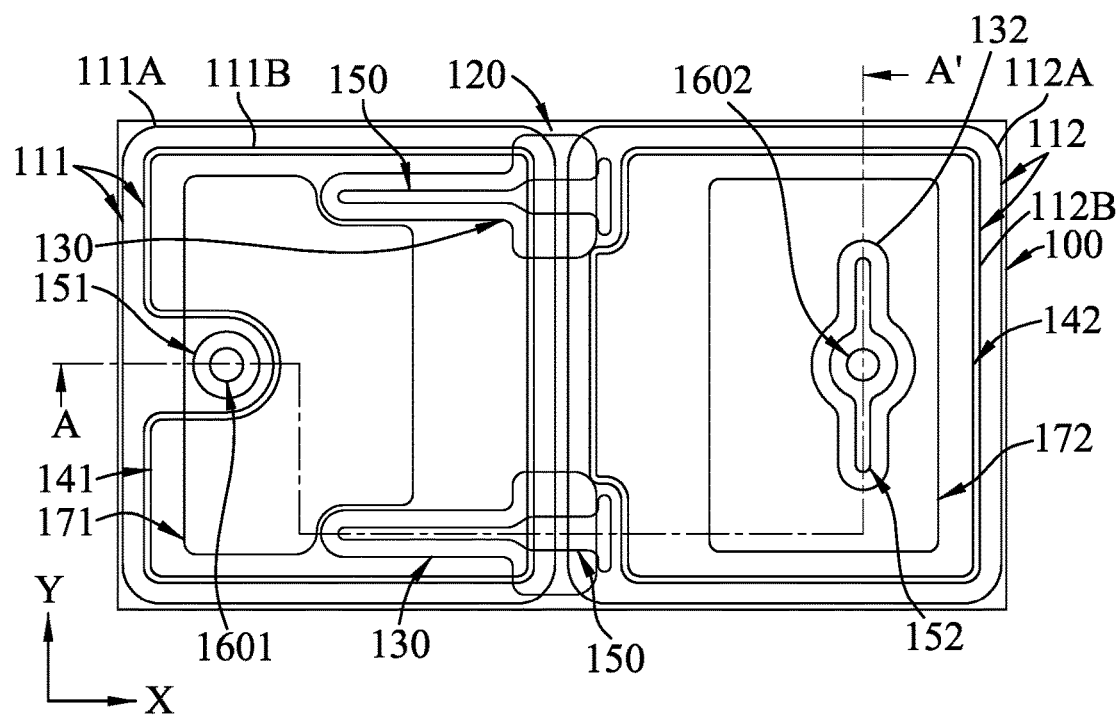
FIG. 1 is a top perspective projection view illustrating a first embodiment of a light-emitting device of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Embodiment 1

Referring to FIGS. 1 to 12, a light-emitting device in accordance with a first embodiment of the disclosure is illustrated. The light-emitting device includes a substrate 100, a first mesa structure 111, a second mesa structure 112, at least one current blocking element 130, at least one conductive bridging element 150, a first conductive pad 171, and a second conductive pad 172.

The substrate 100 may be made of sapphire ($Al_2O_3$), but is not Limited thereto.

Figure 2:
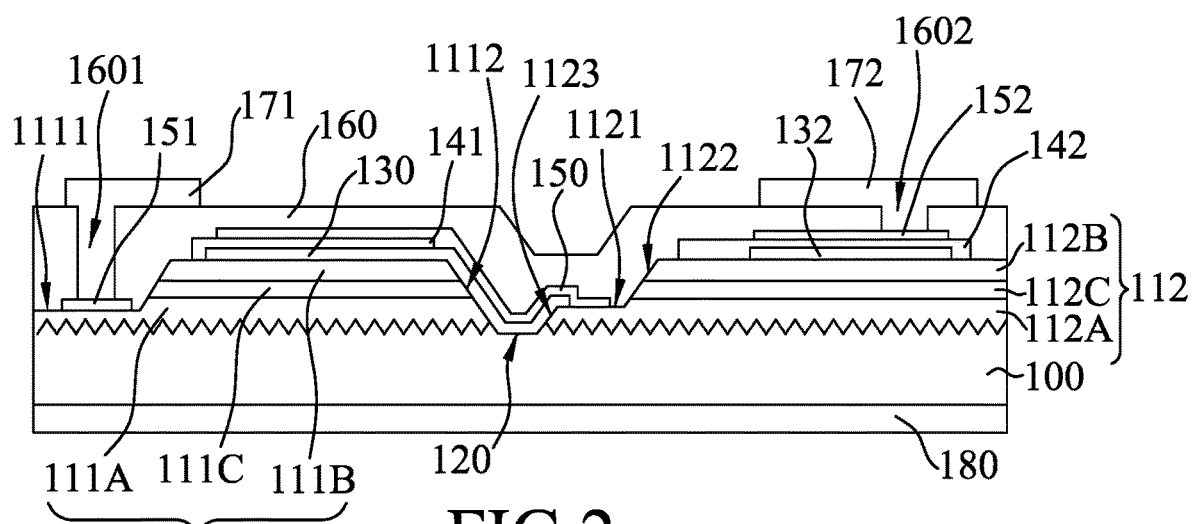
FIG. 2 is a cross-sectional schematic view taken along line A-A' in FIG. 1.
Figure 3:
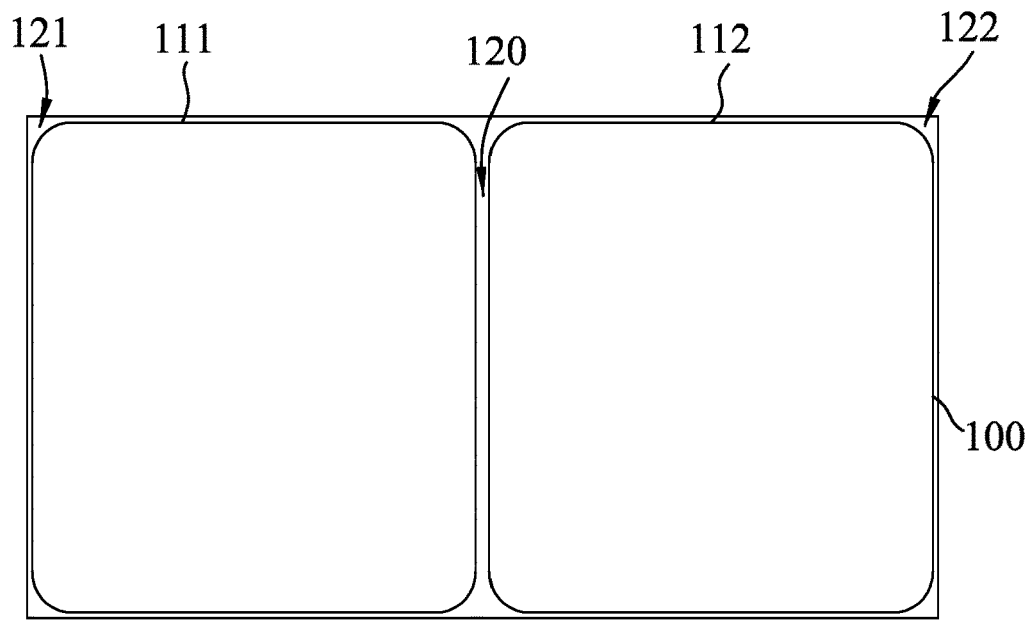
FIG. 3 is a top perspective projection view illustrating a groove of the first embodiment of the light-emitting device.

The first and second mesa structure 111, 112 are separately disposed on the substrate 100 with a groove 120 formed therebetween. As shown in FIG. 3, the substrate 100 is formed with a first trench 121 and a second trench 122 surrounding the first mesa structure 111 and the second mesa structure 112, respectively. The first and second trenches 121, 122 may be formed by a deep trench isolation process. A portion of the first trench 121 and a portion of the second trench 122 that are located between the first mesa structure 111 and the second mesa structure 112 define the groove 120 having a bottom, as shown in FIG. 2. In this embodiment, the first and second mesa structure 111, 112 are arranged along an X-direction, as shown in FIG. 1.

Each of the first and second mesa structures 111, 112 includes a first type semiconductor layer 111A, 112A disposed on the substrate 100, an active layer 111O, 112C disposed on the first type semiconductor layer 111A, 112A, and a second type semiconductor layer 111B, 112B disposed on the active layer 111O, 112C. A portion 1111 of the first type semiconductor layer 111A of the first mesa structure 111 is exposed from the second type semiconductor layer 111E and the active layer 111O of the first mesa structure 111, and a portion 1121 of the first type semiconductor layer. 112A of the second mesa structure 112 is exposed from the second type semiconductor layer 112B and the active layer 112C of the second mesa structure 112. The first mesa structure 111 has a side surface 1112 that is defined by the first type semiconductor layer 111A, the active layer 111C and the second type semiconductor layer 111B of the first mesa structure 111. The second mesa structure 112 has a side surface 1122 that is defined by the first type semiconductor layer 112A, the active layer 112C and the second type semiconductor layer. 112B of the second mesa structure 112.

The first type semiconductor layers 111A, 112A have a conductivity type opposite to that of the second type semiconductor layers 111B, 112B. In some embodiments, each of the first type semiconductor layers 111A, 112A may be formed as a multi-layered structure that includes a buffer layer disposed on the substrate 100 and an n-type semiconductor layer disposed on the buffer layer. Each of the active layers 111C, 112C may be formed as a multi-quantum-well structure. Each of the second type semiconductor layers 111B, 112B may be formed as a multi-layered structure that includes a p-type semiconductor layer.

Figure 4:
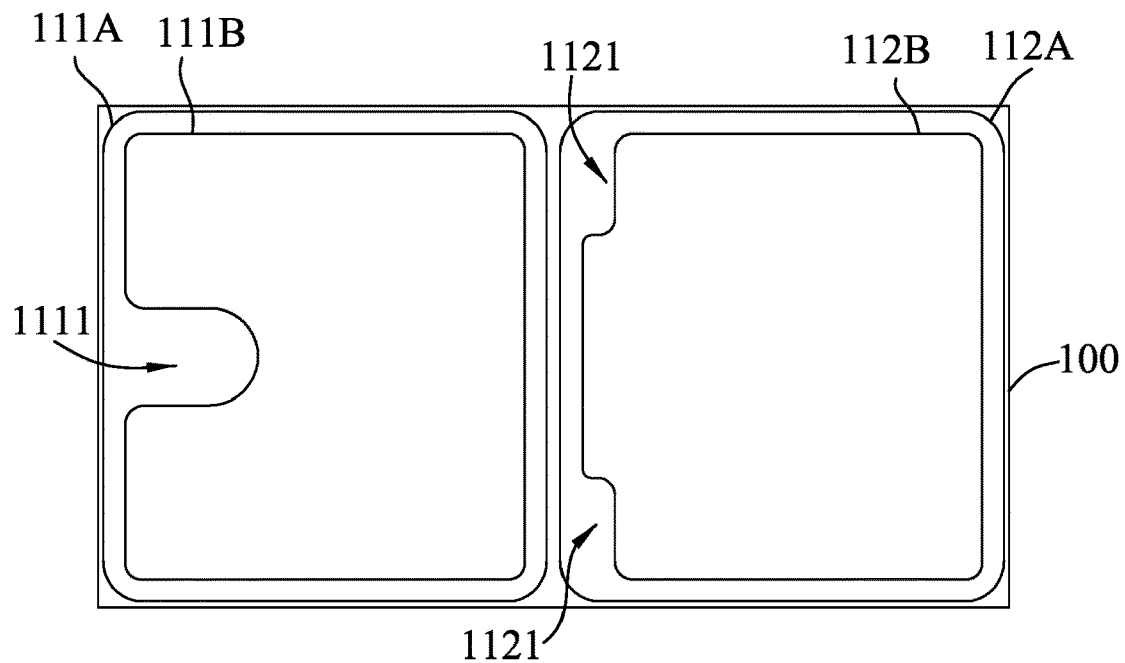
FIG. 4 is a top perspective projection view illustrating first and second mesa structures of the first embodiment of the light-emitting device.

In this embodiment, the first type semiconductor layer 112A of the second mesa structure 112 has two of the exposed portions 1121 exposed from the active layer. 112C and the second types semiconductor layer 112B, as shown in FIG. 4. In other embodiments, the number of the exposed portion 1121 of the first type semiconductor layer 112A of the second mesa structure 112 may be one.

The at least one current blocking element 130 is disposed on the second type semiconductor layer 111B of the first mesa structure 111 to expose a portion of the second type semiconductor layer 111E of the first mesa structure 111, and extends to the side surface 1112 of the first mesa structure 111, the bottom of the groove 120 and a portion 1123 of the side surface 1122 of the second mesa structure 112 defined by the first type semiconductor layer 112A in a continuous manner.

The at least one current blocking element 130 has a number corresponding to a number of the exposed portion(s) 1121 of the first type semiconductor layer 112A of the second mesa structure 112. In this embodiment, the number of the current blocking element 130 of the light-emitting device is two. For purposes of simplicity and clarity, only one of the current blocking elements 130 is taken as an example for description hereinafter.

The current blocking element 130 may be made of a transparent insulating material, such as silicon dioxide, but is not limited thereto.

Figure 5:
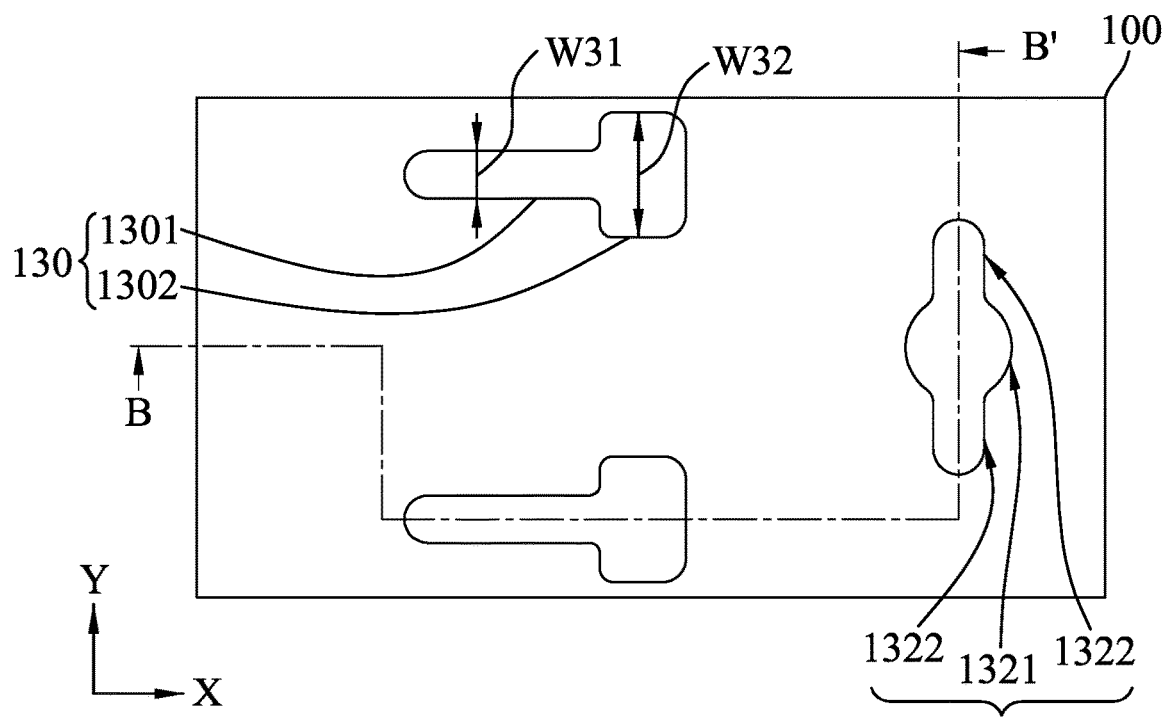
FIG. 5 is a top perspective projection view illustrating at least one current blocking element and a current blocking structure of the first embodiment of the light-emitting device.
Figure 6:
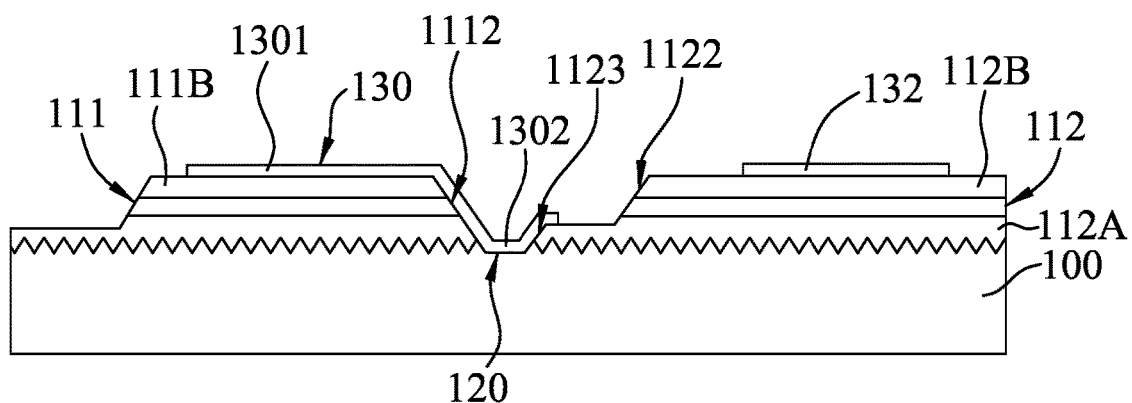
FIG. 6 is a cross-sectional schematic view taken along line B-B' in FIG. 5.

In this embodiment, the current blocking element 130 includes a head portion 1301 that is disposed on the second type semiconductor layer 111B of the first mesa structure 111, and a tail portion 1302 that extends from the head portion 1301 to the side surface 1112 of the first mesa structure 111, the bottom of the groove 120 and the portion 1123 of the side surface 1122 of the second mesa structure 112 defined by the first type semiconductor layer 112A in a continuous manner, as shown in FIGS. 5 and 6. To be specific, the tail portion 1302 of the current blocking element 130 is disposed on the side surface 1112 of the first mesa structure 111 to expose a portion of the side surface 1112 of the first mesa structure 111, and is disposed on the side surface 1122 of the second mesa structure 112 to expose a portion of the side surface 1122 of the second mesa structure 112.

The tail portion 1302 has a width W32 that is larger than a width W31 of the head portion 1301, so as to ensure completeness of the tail portion 1302. In this embodiment, the width W32 and the width W31 are widths defined in a Y-direction that is perpendicular to the X-direction, as shown in FIG. 5.

Figure 9:
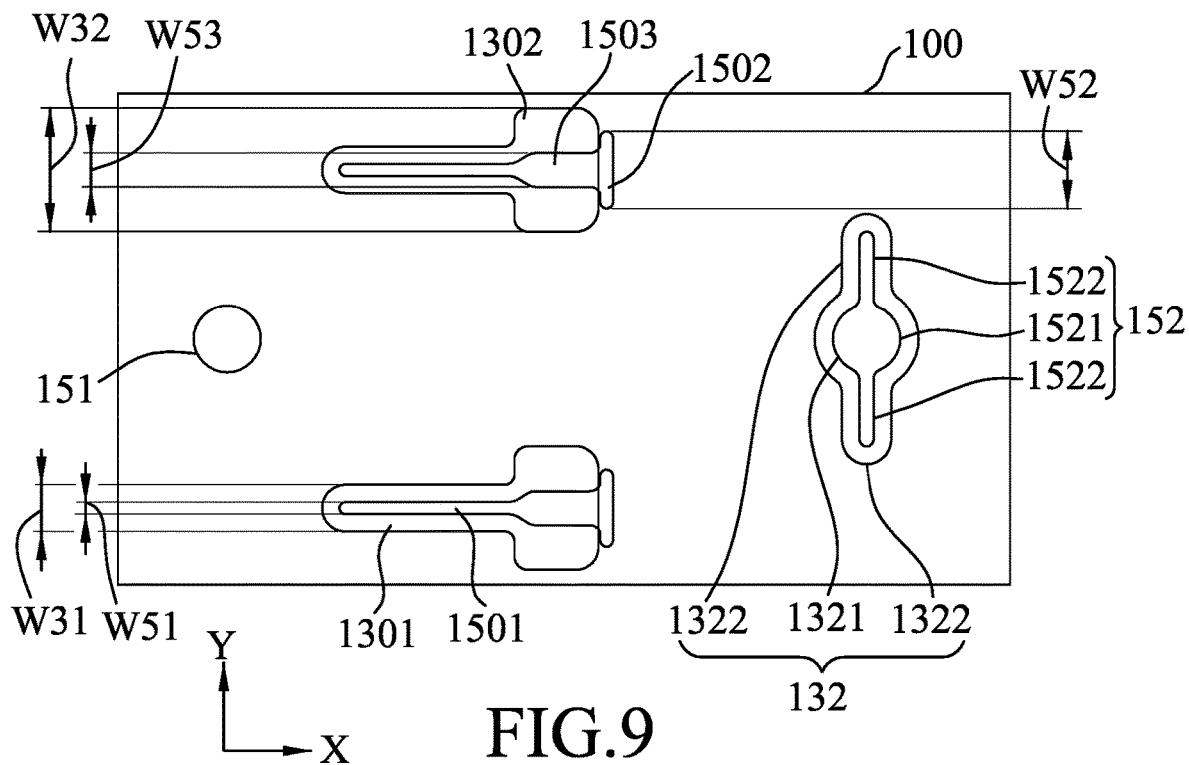
FIG. 9 is a top perspective projection view illustrating the at least one conductive bridging element, the at least one current blocking element, the first and second conductive blocks, and the current blocking structure of the first embodiment of the light-emitting device.

The at least one conductive bridging element 150 is disposed on the at least one current blocking element 130. The at least one conductive bridging element 150 has a number corresponding to a number of the current blocking element 130. In this embodiment, the number of the conductive bridging element 150 is two, which equals to the number of the current blocking elements 130, as shown in FIG. 9. Hence, chip failure is avoidable even if one of the conductive bridging elements 150 is damaged.

Figure 7:
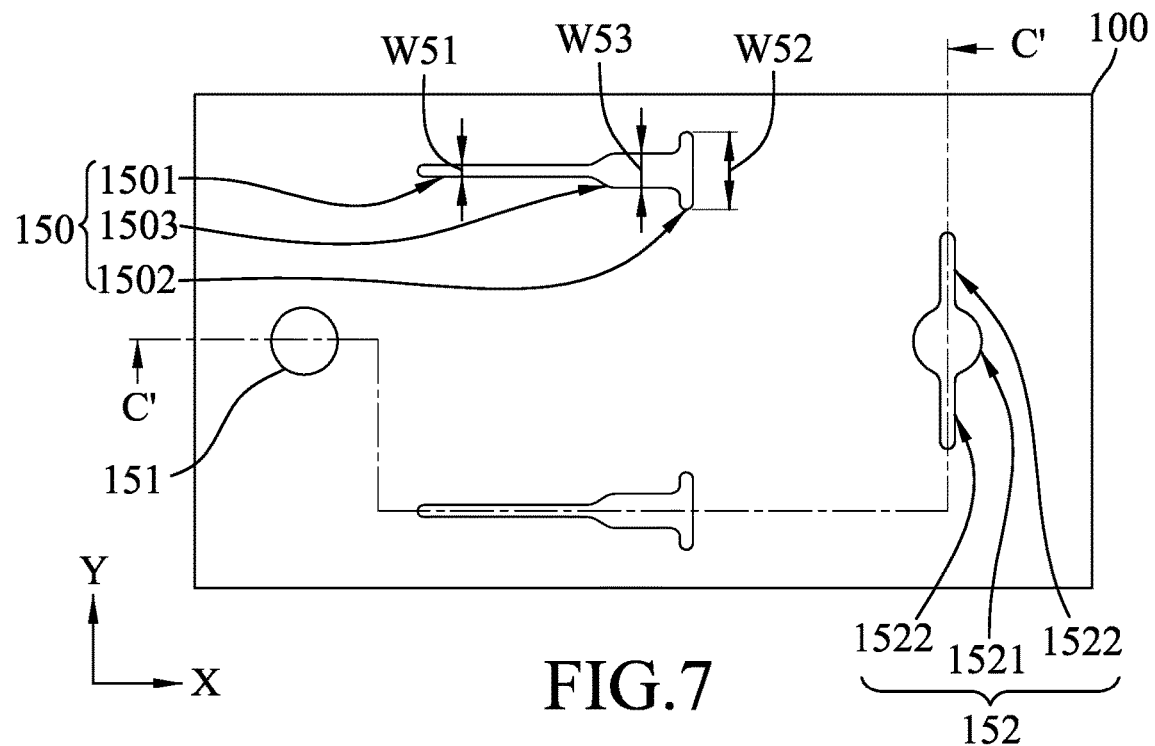
FIG. 7 is a top perspective projection view illustrating at least one conductive bridging element, and first and second conductive blocks of the first embodiment of the light-emitting device.

In this embodiment, each of the conductive bridging elements 150 is disposed on a corresponding one of the current blocking elements 130. The conductive bridging elements 150 are respectively located in corresponding position proximate to two opposite boundaries of the light-emitting device as viewed from top thereof to electrically connect the first and second mesa structures 111, 112 in series, as shown in FIG. 7. Such positional configuration of the conductive bridging elements 150 may reduce chip failure caused by damage of the conductive bridging elements 150 due to improper operation of push-up needles during picking up of the light-emitting device, thereby increasing reliability of final products.

For purposes of simplicity and clarity, only one of the conductive bridging elements 150 is taken as an example for description hereinafter.

The conductive bridging element 150 may be made of a conductive material including a metallic material, a conducting metal oxide, etc. The metallic material, for example, may be selected from the group consisting of copper, silver, gold and alloys thereof, but is nut limited thereto.

Figure 8:
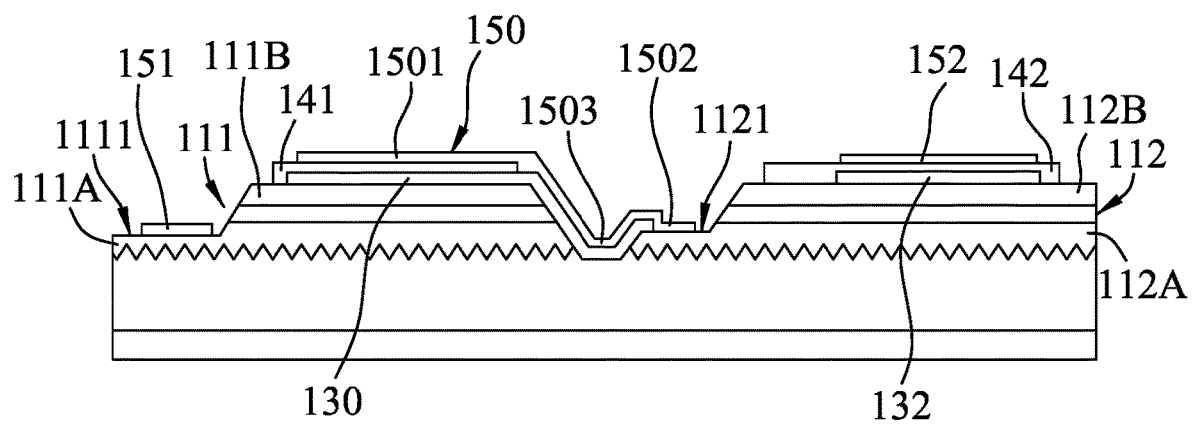
FIG. 8 is a cross-sectional schematic view taken along line C-C' in FIG. 7.

The conductive bridging element 150 includes a body portion 1503, a first portion 1501 that extends from the body portion 1503 and that is electrically connected to the second type semiconductor layer 111E of the first mesa structure 111, and a second portion 1502 that extends from the body portion 1503 and that is electrically connected to the first type semiconductor layer 112A of the second mesa structure 112, as shown in FIG. 8. In this embodiment, the first portion 1501 and the second portion 1502 of the conductive bridging element 150 extends from the body portion 1503 in opposite directions. In this embodiment, the first portion 1501 of the conductive bridging element 150 is electrically connected to the second type semiconductor layer 111B of the first mesa structure 111.

As shown in FIG. 7, the first portion 1501 has a finger-like shape and has a width W51 that is less than a width W53 of the body portion 1503, and the second portion 1502 has a width W52 that is larger than a width W53 of the body portion 1503. That is, the second portion 1502 is relatively blunt with respect to the body portion 1503 and the first portion 1501. In this embodiment, the width W51, the width W52, and the width W53 are widths defined in the Y-direction.

Each of the first, second and body portions 1501, 1502, 1503 of the conductive bridging element 150 defines a bisecting line that geometrically divides each of the first, second and body portions 1501, 1502, 1503 into two symmetrical halves in the top view of the light-emitting device. The bisecting lines of the first, second and body portions 1501, 1502, 1503 coincide with each other in a straight line. Thus, the conductive bridging element 150 has an axisymmetric projection relative to the straight line in the top view of the light-emitting device. In this embodiment, the conductive bridging element 150 has a nail-like shape with mirror-symmetry.

Owing to the width configuration of the conductive bridging element 150, the body portion 1503 is able to continuously extend across the groove 120, and the second portion 1502 has a large contact area on the first type semiconductor layer 112A of the second mesa structure 112, which leads to a lower resistance and is beneficial for improving reliability of final products.

It is noted that a respective one of the exposed portions 1121 of the first type semiconductor layer 112A of the second mesa structure 112 has a shape corresponding to that of the second portion 1502 of the conductive bridging element 150, as shown in FIGS. 1, 4, and 7. Further, the respective one of the exposed portions 1121 of the first type semiconductor layer 112A of the second mesa structure 112 is adjacent to the first mesa structure 111, and is located in position corresponding to the conductive bridging element 150, so that the second portion 1502 of the conductive bridging element 150 is able to be electrically connected to the first type semiconductor layer 112A of the second mesa structure 112.

FIG. 9 is a top view illustrating positional and dimensional relationship of the current blocking element 130 and the conductive bridging element 150. In this embodiment, the body portion 1503 of the conductive bridging element 150 is disposed on the tail portion 1302 of the current blocking element 130 so as to extend across the groove 120, and has a projection image located within that of the tail portion 1302 in the top view of the light-emitting device. The first portion 1501 of the conductive bridging element 150 is disposed on the head portion 1301 of the current blocking element 130, and has a projection image located within that of the head portion 1301 in the top view of the light-emitting device. The second portion 1502 of the conductive bridging element 150 has a projection image extending outside that of the current blocking element 130 in the top view of the light-emitting device so as to be disposed on the respective one of the exposed portions 1121 of the first type semiconductor layer 112A of the second mesa structure 112.

In actual practice, the tail portion 1302 of the current blocking element 130 may have an uneven thickness. In particular, the tail portion 1302 in corresponding position on the side surface 1112 of the first mesa structure 111 may have a relatively less thickness due to over-etching during patterning of the current blocking element 130.

Hence, as shown in FIG. 9, the width W53 of the body portion 1503 and the width W32 of the tail portion 1302 have a first width difference D1 therebetween, and the width W51 of the first portion 1501 and the width W31 of the head portion 1301 have a second width difference D2 therebetween. The first width difference D1 is larger than the second width difference D2. That is, the width W32 of the tail portion 1302 is configured to be large enough to ensure the body portion 1503 of the conductive bridging element 150 is continuously disposed thereon, such that current leakage may be avoidable and reliability of final products is further improved.

In some embodiments, the first width difference D1 ranges from 6 µm to 200 µm. For example, the first width difference D1 may be 10 µm, 20 µm, 40 µm, 60 µm, or 100 µm. Each of the width difference D1 aims to ensure that current leakage is avoided and that conductivity of the conductive bridging element 150 is maintained.

In some embodiments, the second width difference D2 ranges from 0 µm to 60 µm. For example, the second width difference D2 may be 1 µm, 2 µm, 10 µm, or 20 µm.

The first conductive pad 171 is located in corresponding position above the first mesa structure 111, and is electrically connected to the first type semiconductor layer 111A of the first mesa structure 111. The second conductive pad 172 is located in corresponding position above the second mesa structure 112, and is electrically connected to the second type semiconductor layer 112B of the second mesa structure 112. The first and second conductive pads 171, 172 may be made of a metal or an alloy.

It is noted that the at least one conductive bridging element 150 has a projection image that is spaced apart from those of the first and second conductive pads 171, 172 in the top view of the light-emitting device.

Figure 12:
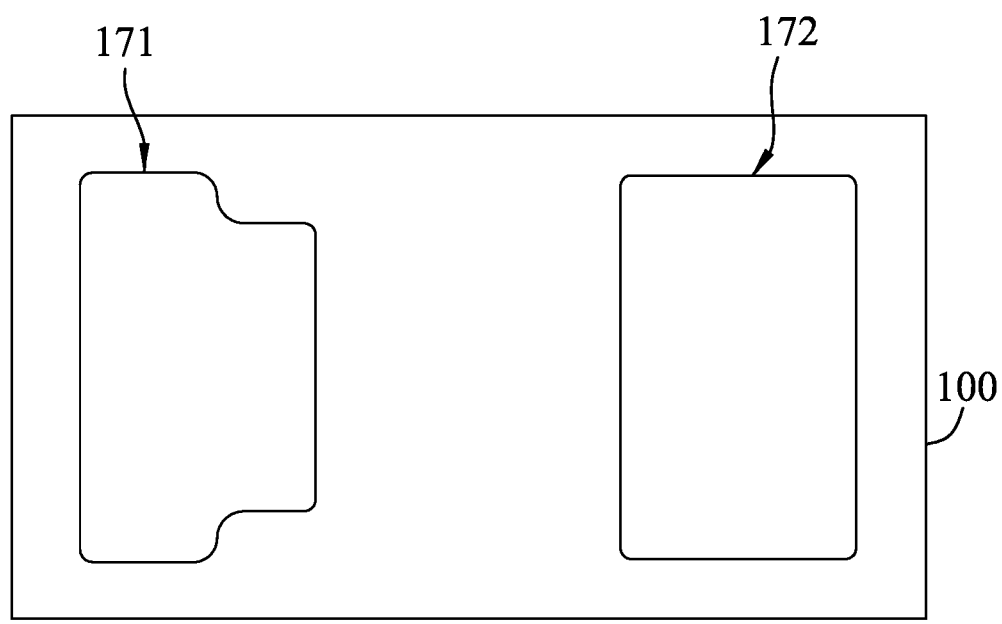
FIG. 12 is a top perspective projection view illustrating first and second conductive pads of the first embodiment of the light-emitting device.
Figure 13:
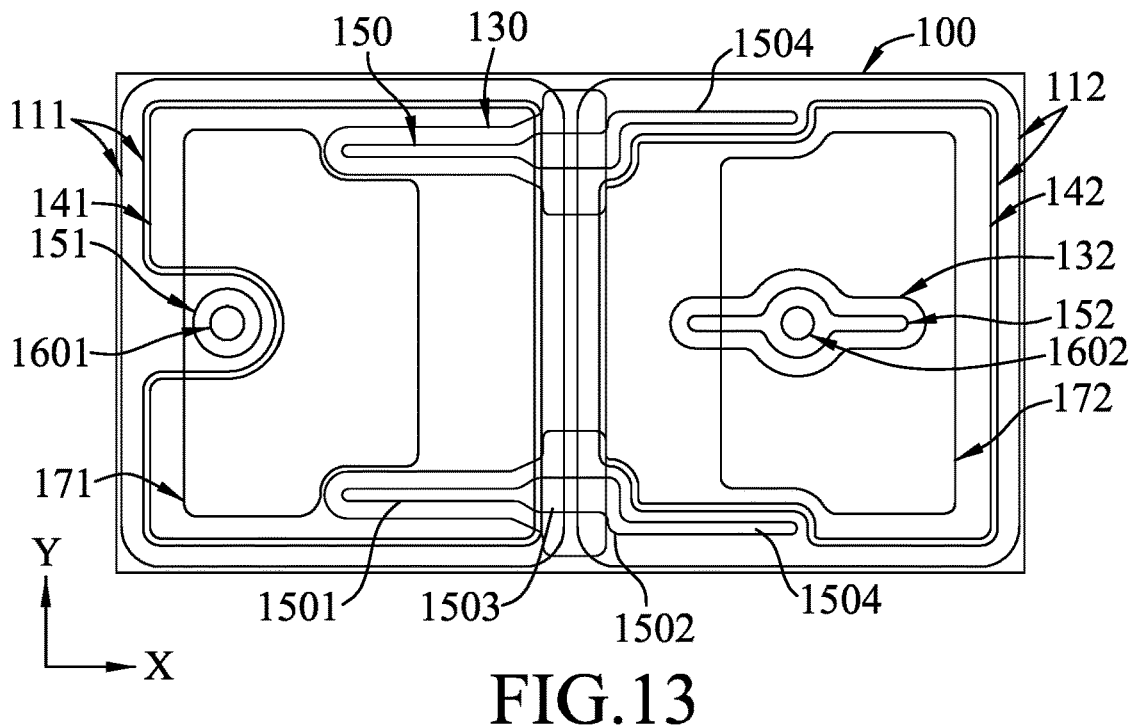
FIG. 13 is a top perspective projection view illustrating a second embodiment of the light-emitting device of the disclosure.
Figure 14:
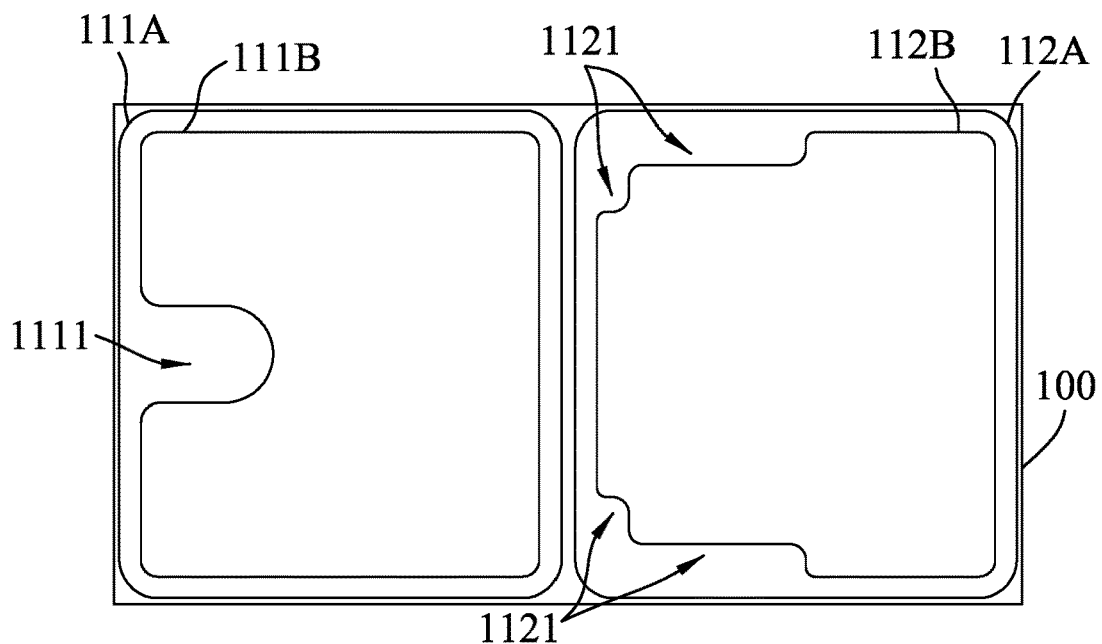
FIG. 14 is a top perspective projection view illustrating the first and second mesa structures of the second embodiment of the light-emitting device.

In this embodiment, the projection image of the first conductive pad 171 has an intervening part located between the projection images of two of the conductive bridging elements 150, as shown in FIG. 1. The intervening part of the first conductive pad 171 extends toward the second conductive pad 172, as shown in FIG. 12.

In this embodiment, the light-emitting device further includes a first conductive block 151 disposed on the exposed portion 1111 of the first type semiconductor layer 111A of the first mesa structure 111, as shown in FIG. 8. The first conductive block 151 has a projection image located within that of the exposed portion 1111 in the top view of the light-emitting device, as shown in FIG. 1. The exposed portion 1111 of the first type semiconductor layer 111A of the first mesa structure 111 has a shape corresponding to that of the first conductive block 151. In this embodiment, the first conductive block 151 is in a form of circle in the top view of the light-emitting device, as shown in FIG. 7.

Furthermore, the first conductive block 151 is equidistant from the conductive bridging elements 150, as shown in FIG. 1.

In terms of process, the first conductive block 151 and the at least one conductive bridging element 150 are made from the same conductive layer.

In this embodiment, the light-emitting device further includes a current blocking structure 132 that is disposed on the second type semiconductor layer 112B of the second mesa structure 112 to expose a portion of the second type semiconductor layer 112B of the second mesa structure 112, as shown in FIG. 6. In actual practice, the current blocking structure 132 and the current blocking element 130 may be made from the same transparent insulating layer.

In this embodiment, the current blocking structure 132 includes a central portion 1321 and two extending portions 1322 that independently extend from the central portion 1321, as shown in FIG. 5. The central portion 1321 has a width larger than each width of the extending portions 1322. In this embodiment, the widths of central portion 1321 and the two extending portions 1322 are defined in the X-direction.

In this embodiment, each of the extending portions 1322 extends in a direction perpendicular to that of the tail portion 1302 of the current blocking structure 132. In other embodiments, each of the extending portions 1322 may extend in a direction parallel to that of the tail portion 1302 of the current blocking structure 132.

In this embodiment, the light-emitting device further includes a second conductive block 152 that is disposed on the current blocking structure 132. The second conductive block 152 has a projection image located within that of the current blocking structure 132 in the top view of the light-emitting device, and may be formed with a shape similar to that of the current blocking structure 132. In this embodiment, the second conductive block 152 includes a central part 1521 and two extending parts 1522 that independently extends from the central part 1521, as shown in FIG. 7. Each of the extending parts 1522 extends in a direction perpendicular to that of the tail portion 1302 of the current blocking structure 132. In other embodiments, each of the extending parts 1522 may extend in a direction parallel to that of the tail portion 1302 of the current blocking structure 132.

As shown in FIG. 9, the central part 1521 has a width larger than each width of the extending parts 1522, and has a projection image located within that of the central portion 1321 of the current blocking structure 132 in the top view of the light-emitting device. Each of the extending parts 1522 has a projection image located within that of a corresponding one of the extending portions 1322 of the current blocking structure 132 in the top view of the light-emitting device. In this embodiment, the widths of the central part 1521 and the two extending parts 1522 are defined in the X-direction.

Furthermore, the second conductive block 152 is equidistant from the conductive bridging elements 150, as shown in FIG. 7. In other words, the second conductive block 152 has a bisecting line coinciding with bisecting lines of the first and second conductive pads 171, 172, as shown in FIG. 1.

In actual practice, the first and second conductive blocks 151, 152 and the conductive bridging element 150 may be made from the same conductive layer.

In this embodiment, the light-emitting device further includes a first current spreading layer 141 that is disposed on the exposed portion of the second type semiconductor layer 111B of the first mesa structure 111 and that is partially disposed between the current blocking element 130 and the conductive bridging element 150. Thus, the conductive bridging element 150 is electrically connected to the second type semiconductor layer 111B of the first mesa structure 111 by the first current spreading layer 141, as shown in FIG. 8.

Figure 10:
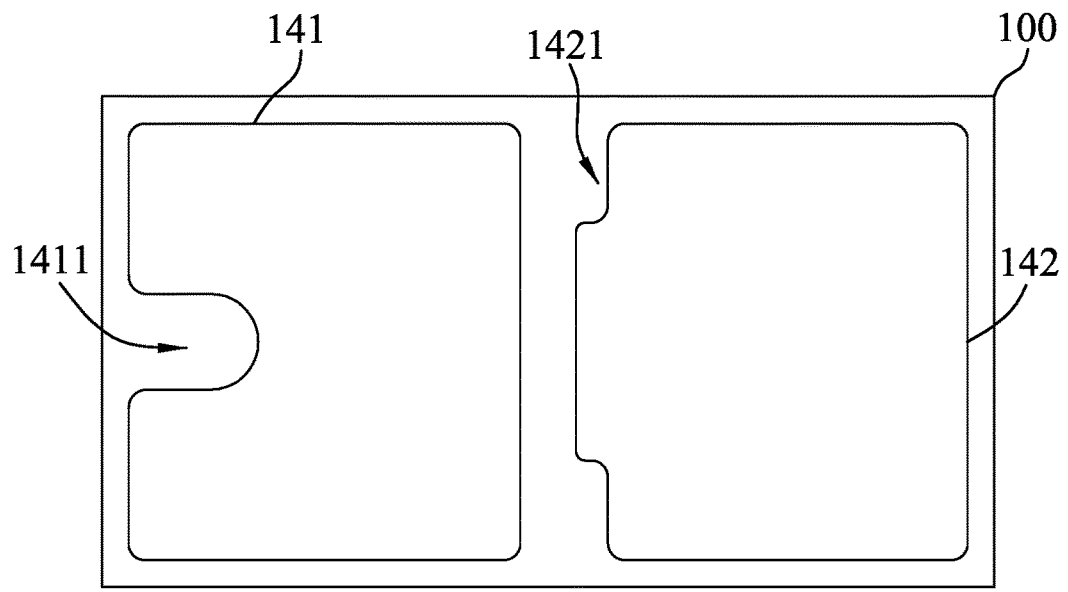
FIG. 10 is a top perspective projection view illustrating first and second current spreading layers of the first embodiment of the light-emitting device.

In this embodiment, the first current spreading layer 141 has a shape similar to that of the second type semiconductor layer 111B of the first mesa structure 111, as shown in FIG. 10. Furthermore, the first current spreading layer 141 has a projection image located within that of the second type semiconductor layer 111B of the first mesa structure 111 in the top view of the light-emitting device. Hence, it can be seen that the projection image of the first current spreading layer 141 has a missing corner 1411 with a shape corresponding to the exposed portion 1111 of the first type semiconductor layer. 111A of the first mesa structure 111.

In this embodiment, the light-emitting device further includes a second current spreading layer 142 that is disposed on the exposed portion of the second type semiconductor layer 112B of the second mesa structure 112 and that is disposed between the current blocking structure 132 and the second conductive block 152. Thus, the second conductive block 152 is electrically connected to the second type semiconductor layer. 112B of the second mesa structure 112 by the second current spreading layer 142.

Owing to the projection image of the second conductive block 152 being located within that of the current blocking structure 132, current injected from the second conductive block 152 is prone to spread along the second current spreading layer 142 first because the current is blocked from direct flowing downwardly from the second conductive block 152 to the second mesa structure 112 by the current blocking structure 132.

In this embodiment, the second current spreading layer 142 has a shape similar to that of the second type semiconductor layer 112B of the second mesa structure 112, as shown in FIG. 10. Furthermore, the second current spreading layer 142 has a projection image located within that of the second type semiconductor layer 112B of the second mesa structure 112 in the top view of the light-emitting device. Hence, it can be seen that the projection image of the second current spreading layer. 141 has two missing corners 1421, each of which has a shape corresponding to a corresponding one of the exposed portions 1121 of the first type semiconductor layer 112A of the second mesa structure 112.

In this embodiment, the light-emitting device further includes a first distributed Bragg reflective layer 160 that covers the first and second current spreading layers 141, 142, the conductive bridging element 150, the first and second conductive blocks 151, 152, and the exposed portions of the side surfaces 1112, 1122 of the first and second mesa structure 111, 112, and that is formed with a first via 1601 to expose the first conductive block 151, and a second via 1602 to expose the second conductive block 152 at position corresponding to the central portion 1321 of the current blocking structure 132. As shown in FIG. 2, the first conductive pad 171 extends through the first via 1601 to be electrically connected to the first, conductive block 151, and the second conductive pad 172 extends through the second via 1602 to be electrically connected to the second conductive block 152.

In this embodiment, the first distributed Bragg reflective layer 160 simultaneously serves as a passivation layer, so as to not only simplify the structure of the light-emitting device but also improve reliability of final products. Furthermore, owing to the projection image of the conductive bridging elements 150, and the first and second conductive pads 171, 172 being spaced apart from each other, current leakage caused by damage of the first distributed Bragg reflective layer 160 can be avoided, thereby increasing reliability of final products.

In this embodiment, the first via 1601 is equidistant from the first portions 1501 of the conductive bridging elements 150, as shown in FIG. 1.

Figure 11:
FIG. 11 is a top perspective projection view illustrating first and second vias of the first embodiment of the light-emitting device.

In this embodiment, the second via 1602 is located at position corresponding to the central part 1521 of the second conductive block 152 rather than any one of the extending parts 1522, as shown in FIG. 11, thereby ensuring that the second conductive pad 172 is electrically connected to the central part 1521 of the second conductive block 152. Therefore, current injected from the second conductive pad 172 may be spread outwardly by two of the extending parts 1522, thereby further facilitating current spreading from the central part 1521 so as to achieve a higher reliability.

In this embodiment, the light-emitting device further includes a second distributed Bragg reflective layer 180 that is disposed on a backside of the substrate 100 opposite to the first and second mesa structures 111, 112.

Embodiment 2

Referring to FIGS. 13 to 18, a second embodiment of the light-emitting device is similar to the first embodiment of the light-emitting device, except that each of the conductive bridging elements 150 further includes a third portion 1504 that extends from the second portion 1502 and that is disposed on the exposed portion 1121 of the first type semiconductor layer 112A of the second mesa structure 112. Hence, the shape of the exposed portions 1121 of the first type semiconductor layer 112A of the second mesa structure 112 and the shape of the second conductive pad 172 are adjusted accordingly. Besides, each of the extending portions 1322 of the current blocking structure 132 extends in a direction perpendicular to that of the first embodiment. Hence, the second conductive block 152 disposed on the current blocking structure 132 has a shape adjusted along with that of the current blocking structure 132.

For purposes of simplicity and clarity, only one of the conductive bridging elements 150 and one of the current blocking elements 130 are taken as an example for description hereinafter.

Figure 16:
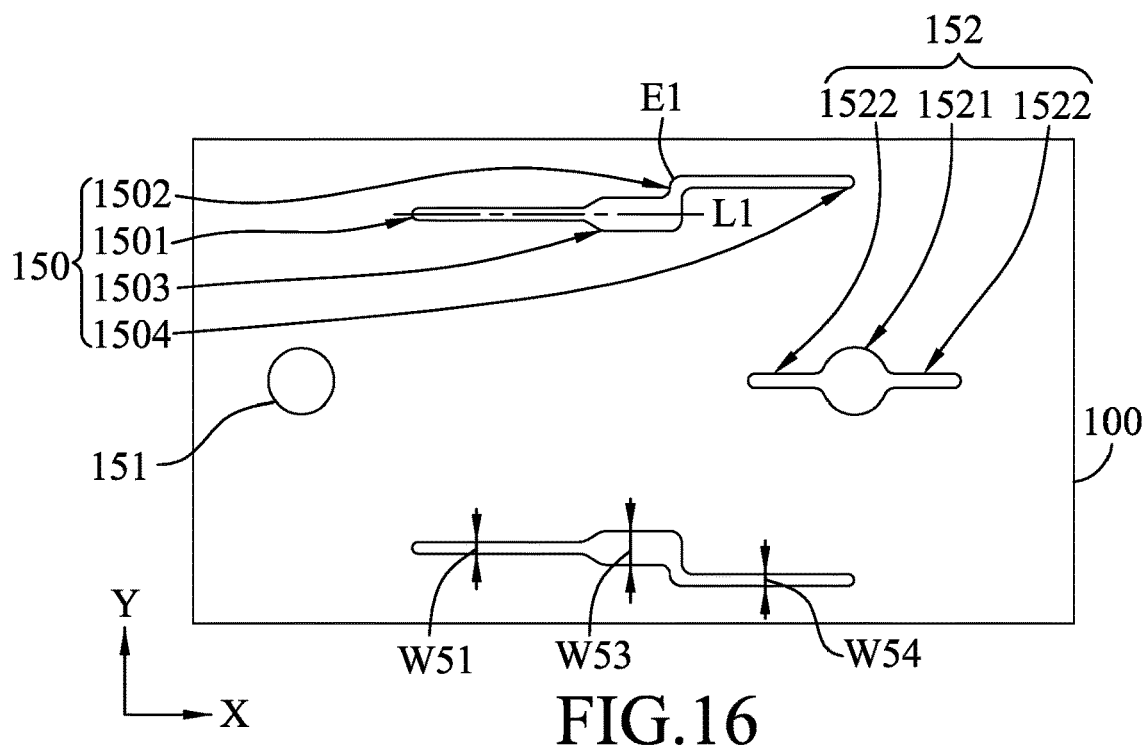
FIG. 16 is a top perspective projection view illustrating the at least one conductive bridging element, and the first and second conductive blocks of the second embodiment of the light-emitting device.
Figure 17:
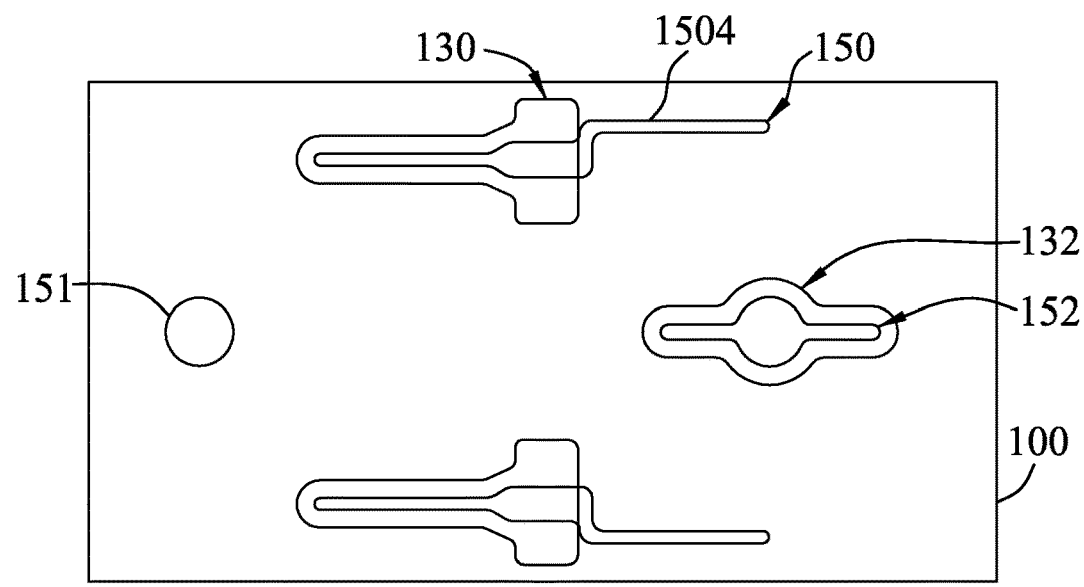
FIG. 17 is a top perspective projection view illustrating the at least one conductive bridging element, the at least one current blocking element, the first and second conductive blocks, and the current blocking structure of the second embodiment of the light-emitting device.

In this embodiment, similar with the second portion 1502 of the conductive bridging element 150, the third portion 1504 of the conductive bridging element 150 has a projection image extending outside that of the current blocking element 130 in the top view of the light-emitting device, as shown in FIG. 17. Yet, the third portion 1504 has a finger-like shape, and has a width W54 that is less than a width W53 of the body portion 1503, as shown in FIG. 16. In some embodiments, the width W54 of the third portion 1504 may be equal to that of the first portion W51. Such width configuration of the third portion 1504 may further optimize the light-emitting device in terms of structure and increase reliability thereof.

The third portion 1504 of the conductive bridging element 150 defines a bisecting line that geometrically divides itself into two symmetrical halves in the top view of the light-emitting device. As shown in FIG. 16, the bisecting lines of the first portion 1501 and the body portion 1503 coincide with each other in a first line L1. The bisecting line of the third portion 1504 is parallel to the first line L1. Further, the second portion 1502 has a first end E1 that is proximate to a respective one of the two opposite boundaries of the light-emitting device, and the third portion 1504 extends from the first end E1 of the second portion 1502 in a direction of the first line. It is noted that an alignment offset may occur between the bisecting lines of the first portion 1501 and the body portion 1503 which is caused by process error during fabrication of reticles, and which is known to those skilled in the art of semiconductor fabrication.

In other embodiments, the bisecting line of the third portion 1504 may coincide with the bisecting line of the body portion 1503 in a second line. The body portion 1503 has a second end distal from the respective boundary of the light-emitting device, and the first portion 1501 extends from the second end of the second portion 1502 in a direction of the second line.

In this embodiment, the respective one of the exposed portions 1121 of the first type semiconductor layer 112A of the second mesa structure 112 has an area larger than that of the first embodiment so as to allow the third portion 1504 of the conductive bridging element 150 to be disposed on the first type semiconductor layer 112A of the second mesa structure 112. It can be seen that the second type semiconductor layer. 112B of the second mesa structure 112 has three different widths in the Y-direction, as shown by the dotted lines in FIG. 14. Further, the conductive bridging element 150 has a larger contact area on the first type semiconductor layer. 112A of the second mesa structure 112 with respect to that of the first embodiment, which is beneficial to connect the first and second mesa structures 111, 112 in series with lower resistance, thereby improving reliability of final products.

In this embodiment, the tail portion 1302 of the current blocking element 130 has a width W32 that is at least 1.5 times larger than a width W31 of the head portion 1301. For example, the tail portion 1302 may have a width W32 that is 1.5 times, 2 times, or even 2.5 times larger than a width W31 of the head portion 1301.

Figure 15:
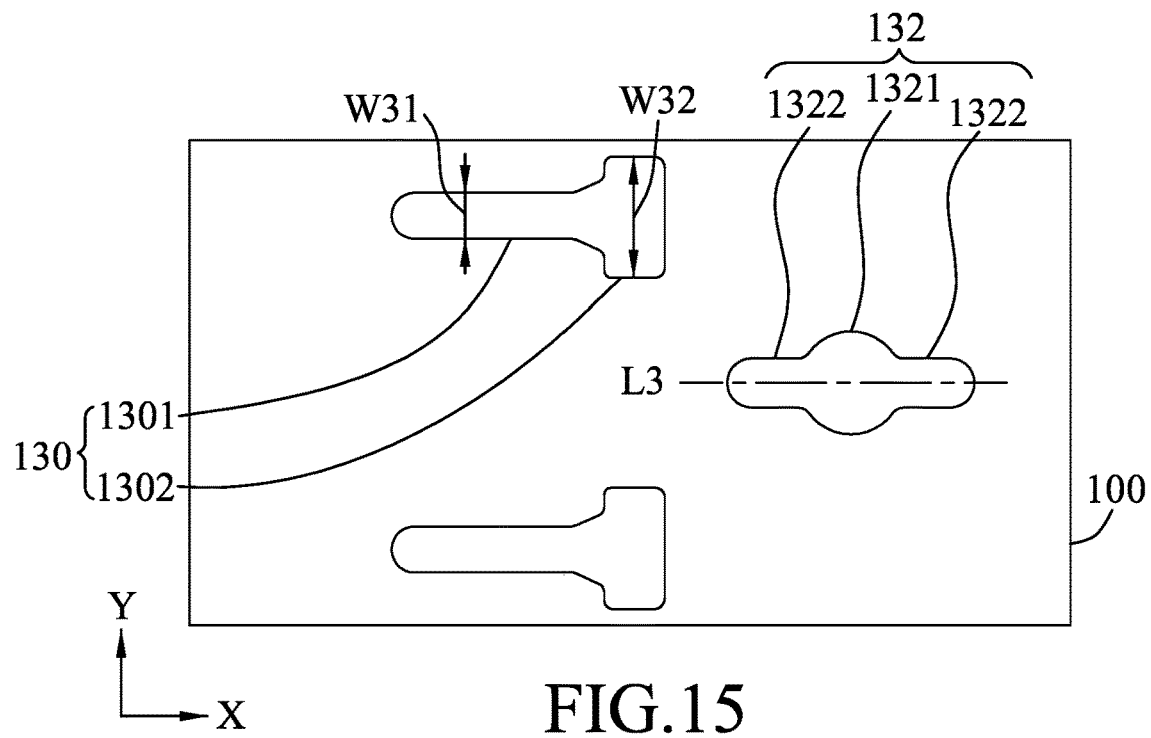
FIG. 15 is a top perspective projection view illustrating the at least one current blocking element and the current blocking structure of the second embodiment of the light-emitting device.

In this embodiment, each of the central portion 1321 and two extending portions 1322 of the current blocking structure 132 have a bisecting line that geometrically divides each of the central portion 1321 and two extending portions 1322 of the current blocking structure 132 into two symmetrical halves in the top view of the light-emitting device. The bisecting lines of the central portion 1321 and two extending portions 1322 coincide with each other in a third line L3. The third line is parallel to the first line L1, as shown in FIG. 15.

Accordingly, the central part 1521 and the two extending parts 1522 of the conductive bridging element 150 extend along the third line L3.

Figure 18:
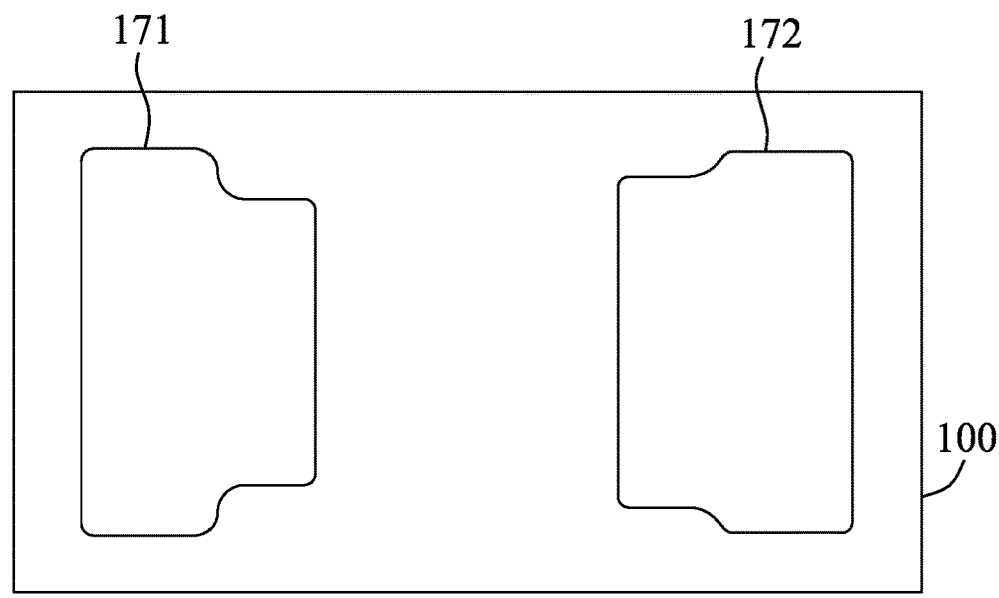
FIG. 18 is a top perspective projection view illustrating the first and second conductive pads of the second embodiment of the light-emitting device.

In this embodiment, the projection image of the second conductive pad 172 has an intervening part located between the projection images of the conductive bridging elements 150. The projection images of the first and second conductive pads 171, 172 are substantially two-fold rotationally symmetrical, as shown in FIG. 18. That is, the projection images of the first and second conductive pads 171, 172 are roughly two-fold rotationally symmetrical, except that the shape of the respective intervening part may be slightly different.

Embodiment 3

Figure 19:
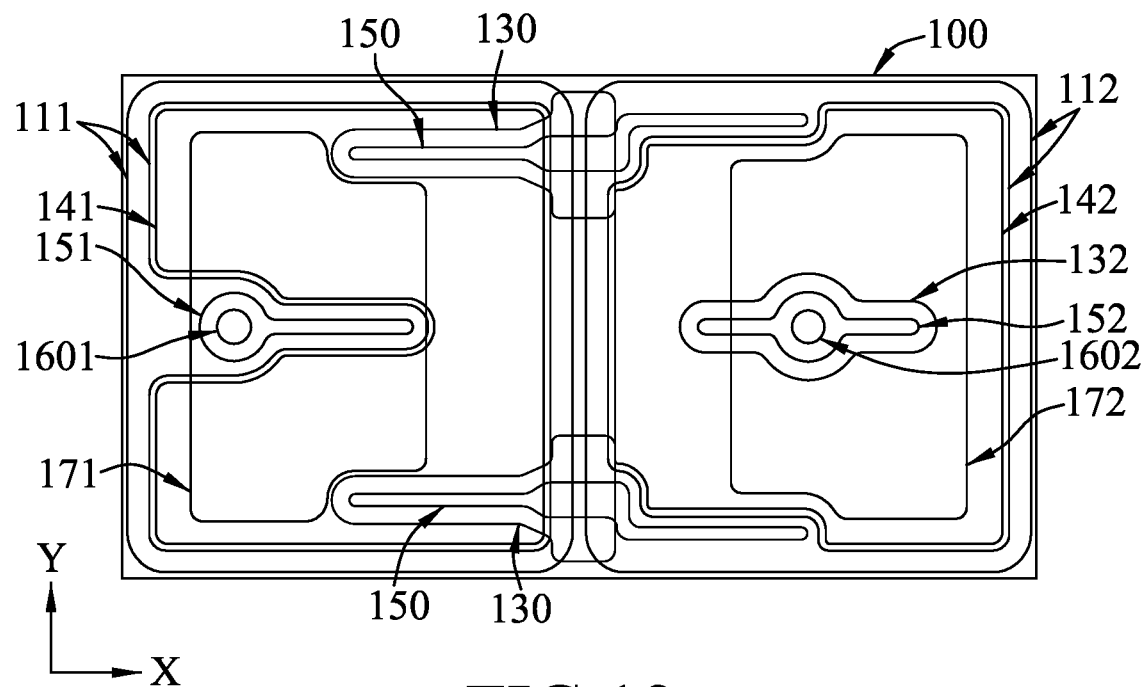
FIG. 19 is a top perspective projection view illustrating a third embodiment of the light-emitting device of the disclosure.
Figure 20:
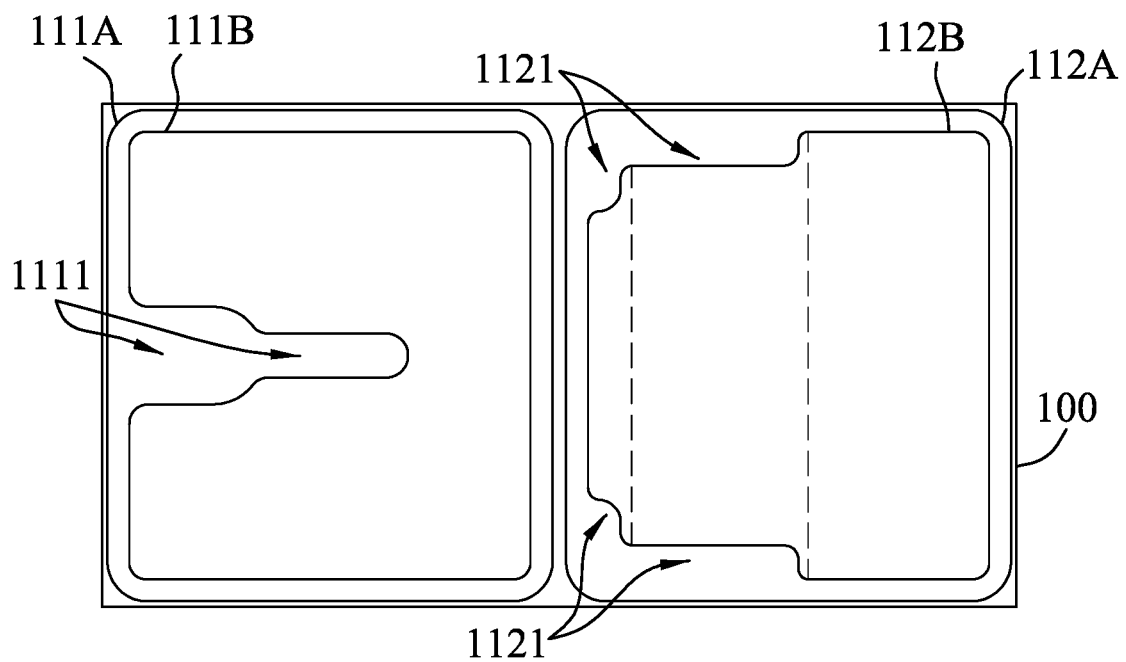
FIG. 20 is a top perspective projection view illustrating the first and second mesa structures of the third embodiment of the light-emitting device.
Figure 21:
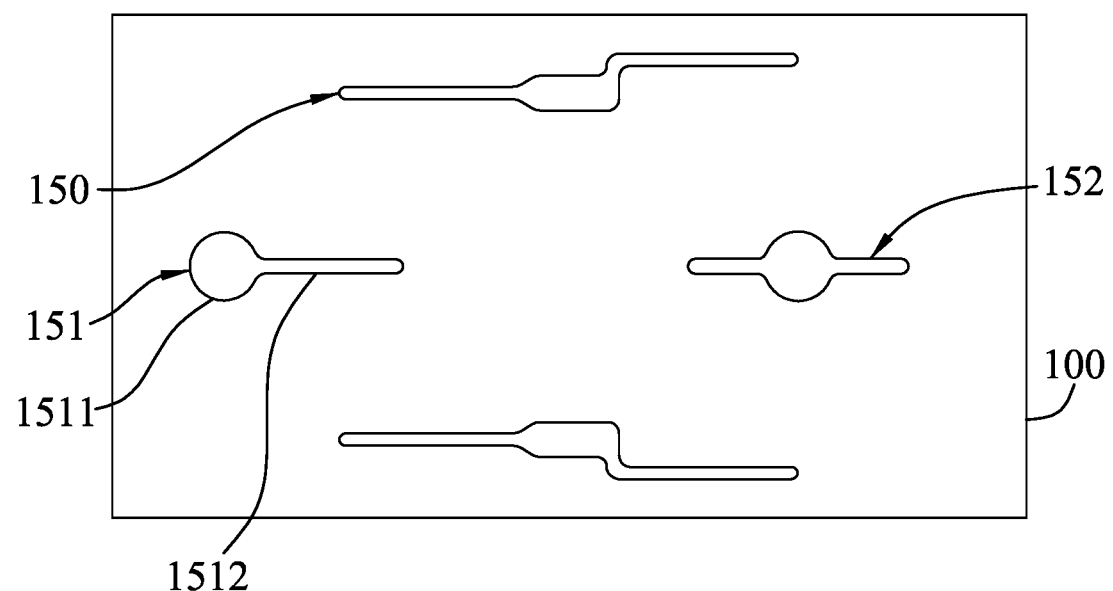
FIG. 21 is a top perspective projection view illustrating the at least one conductive bridging element, and the first and second conductive blocks of the third embodiment of the light-emitting device.

Referring to FIGS. 19 to 21, a third embodiment of the light-emitting device is similar to the second embodiment of the light-emitting device, except that the first conductive block 151 is in a form of round head nail in the top view of the light-emitting device, and the shape of the exposed portion 1111 of the first type semiconductor layer 111A of the first mesa structure 111 is adjusted accordingly.

The first conductive block 151 has a bisecting line that geometrically divides the first conductive block 151 into two symmetrical halves in the top view of the light-emitting device. The bisecting line of the first conductive block 151 is parallel to the first line L1, and coincides with that of the first mesa structure 111, which is beneficial to current spreading.

In this embodiment, the first conductive block 151 includes a head part 1511 and a tail part 1512 that extends from the head part 1511 toward the second mesa structure 112.

In this embodiment, the first via 1601 is formed to expose the head part 1511 of the first conductive block 151.

Embodiment 4

Figure 22:
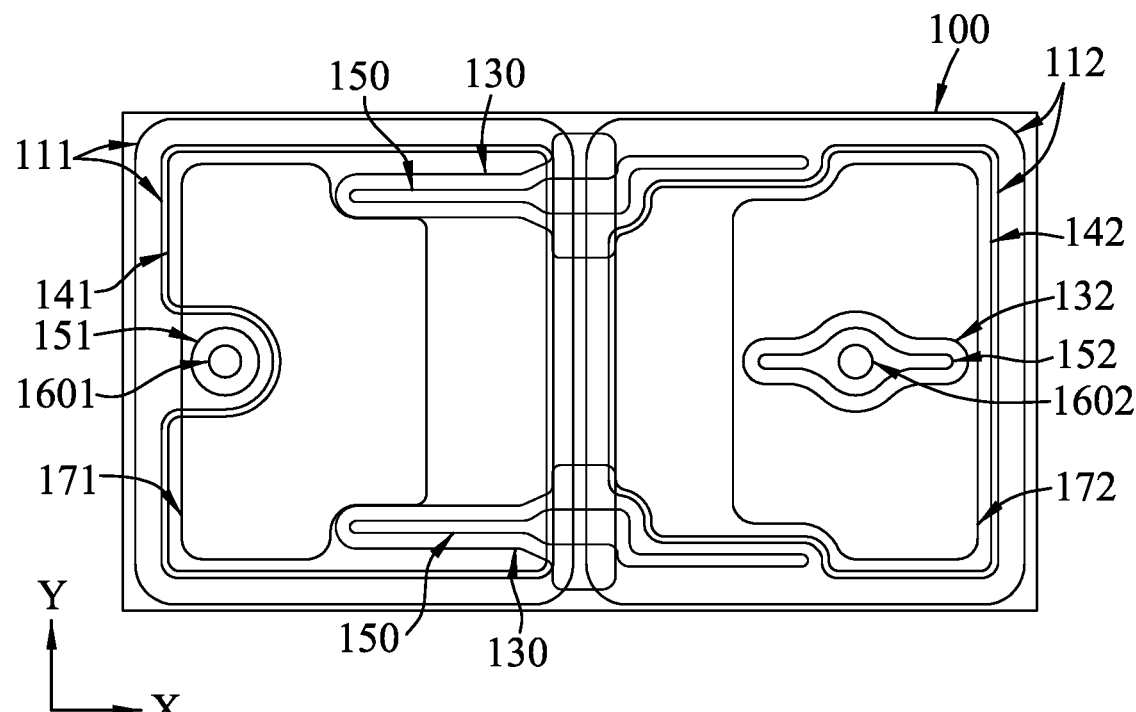
FIG. 22 is a top perspective projection view illustrating a fourth embodiment of the light-emitting device of the disclosure.
Figure 23:
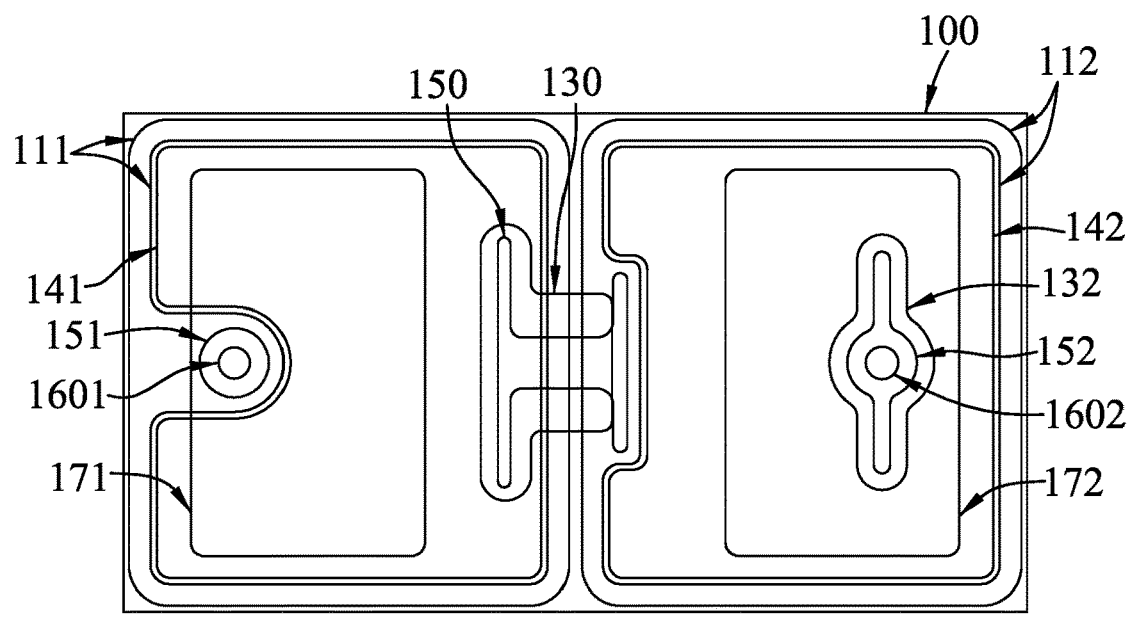
FIG. 23 is a top perspective projection view illustrating a fifth embodiment of the light-emitting device of the disclosure.
Figure 24:
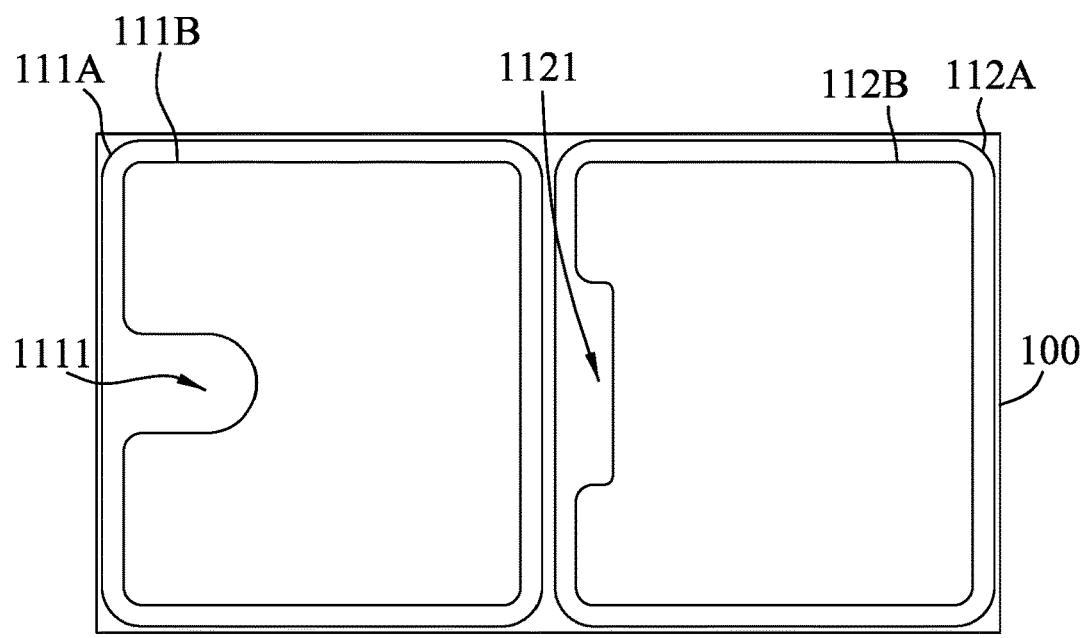
FIG. 24 is a top perspective projection view illustrating the first and second mesa structures of the fifth embodiment of the light-emitting device.
Figure 25:
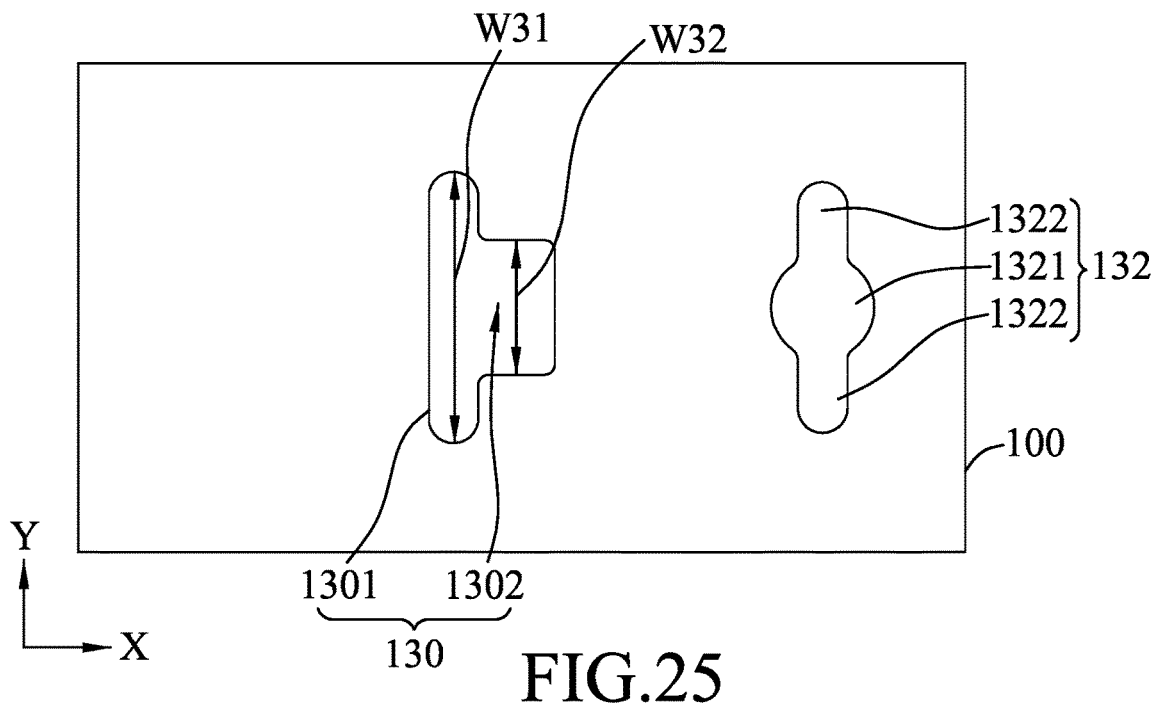
FIG. 25 is a top perspective projection view illustrating the at least one current blocking element and the current blocking structure of the fifth embodiment of the light-emitting device.
Figure 26:
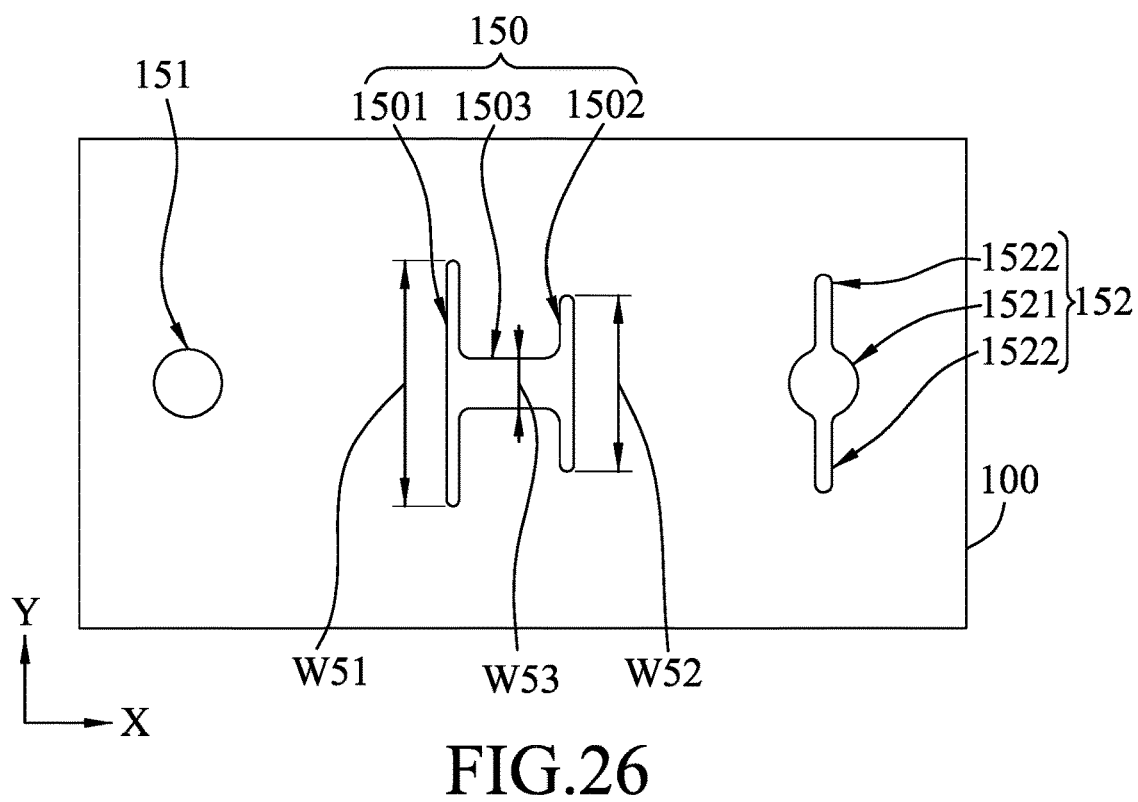
FIG. 26 is a top perspective projection view illustrating the at least one conductive bridging element, and the first and second conductive blocks of the fifth embodiment of the light-emitting device.
Figure 27:
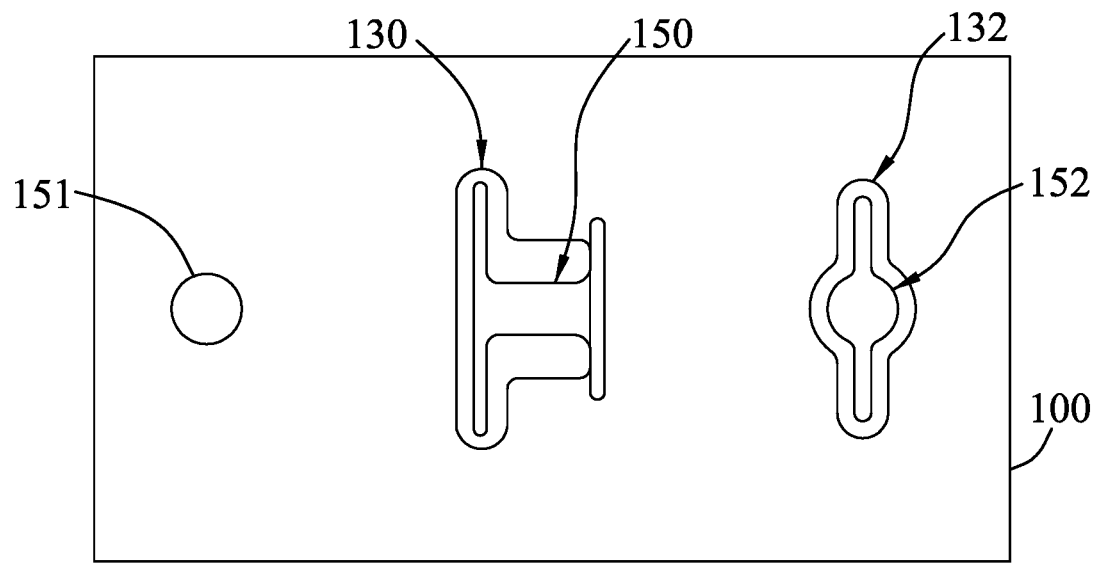
FIG. 27 is a top perspective projection view illustrating the at least one conductive bridging element, the at least one current blocking element, the first and second conductive blocks, and the current blocking structure of the fifth embodiment of the light-emitting device.
Figure 28:
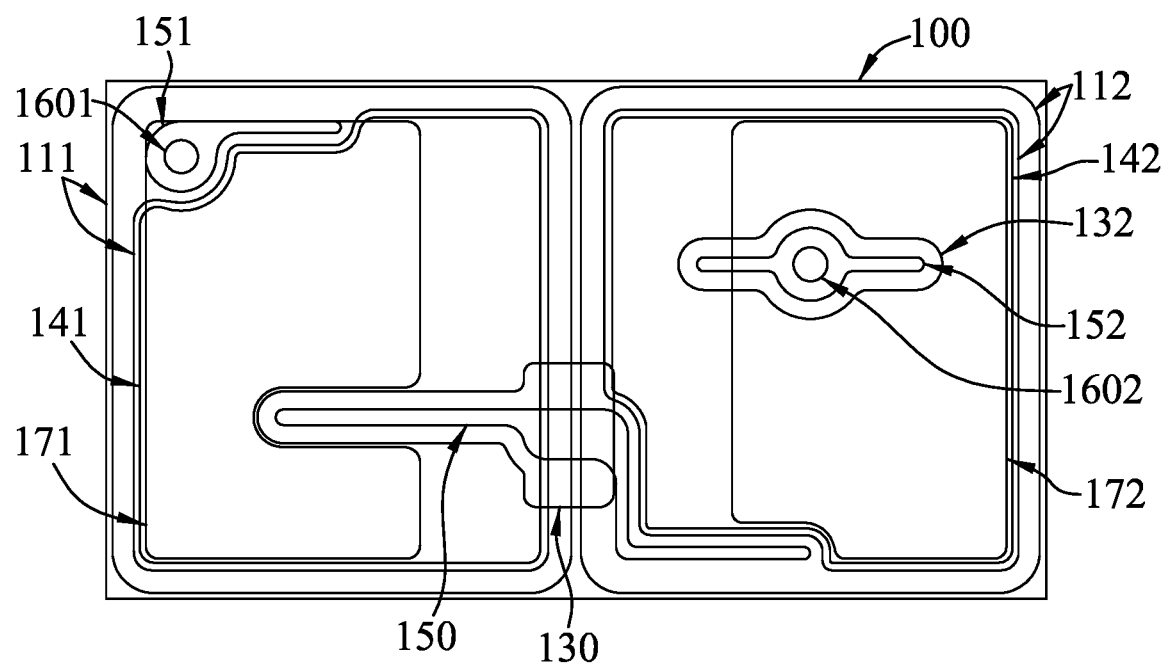
FIG. 28 is a top perspective projection view illustrating a sixth embodiment of the light-emitting device of the disclosure.
Figure 29:
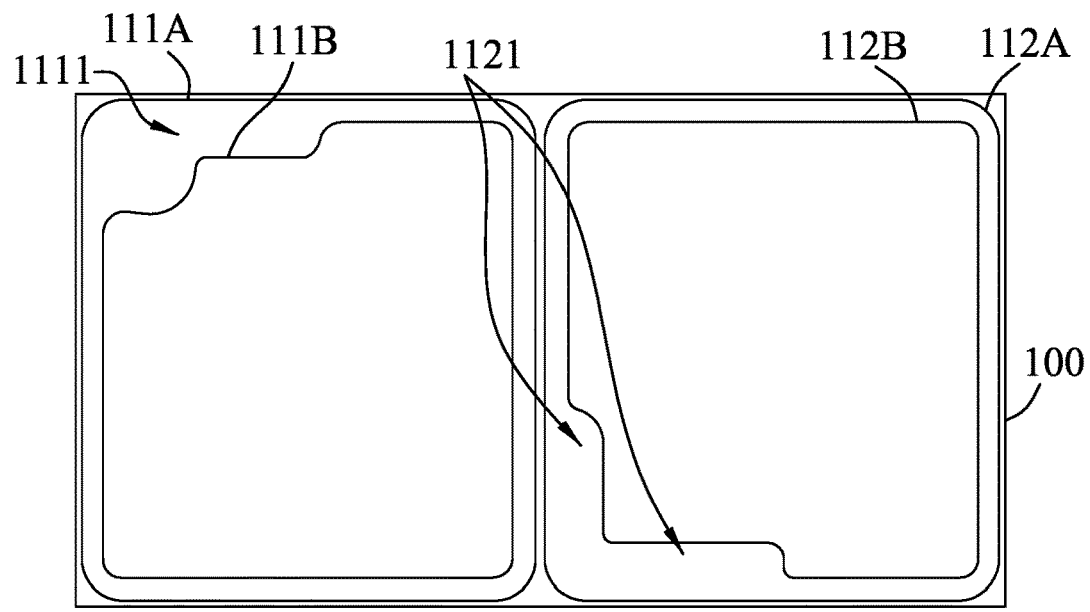
FIG. 29 is a top perspective projection view illustrating the first and second mesa structures of the sixth embodiment of the light-emitting device.
Figure 30:
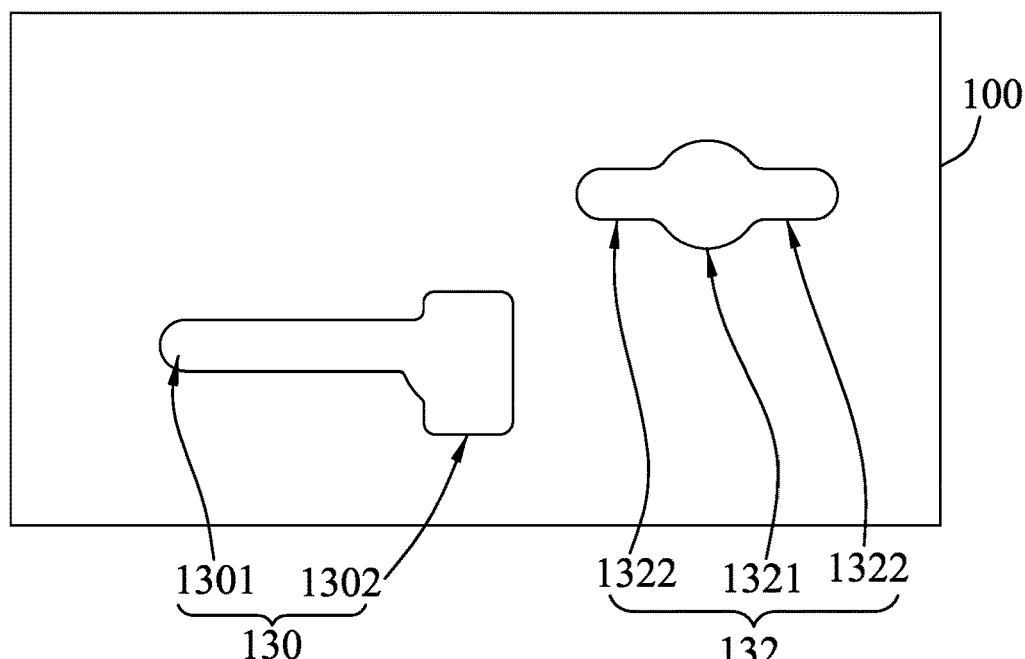
FIG. 30 is a top perspective projection view illustrating the at least one current blocking element and the current blocking structure of the sixth embodiment of the light-emitting device.
Figure 31:
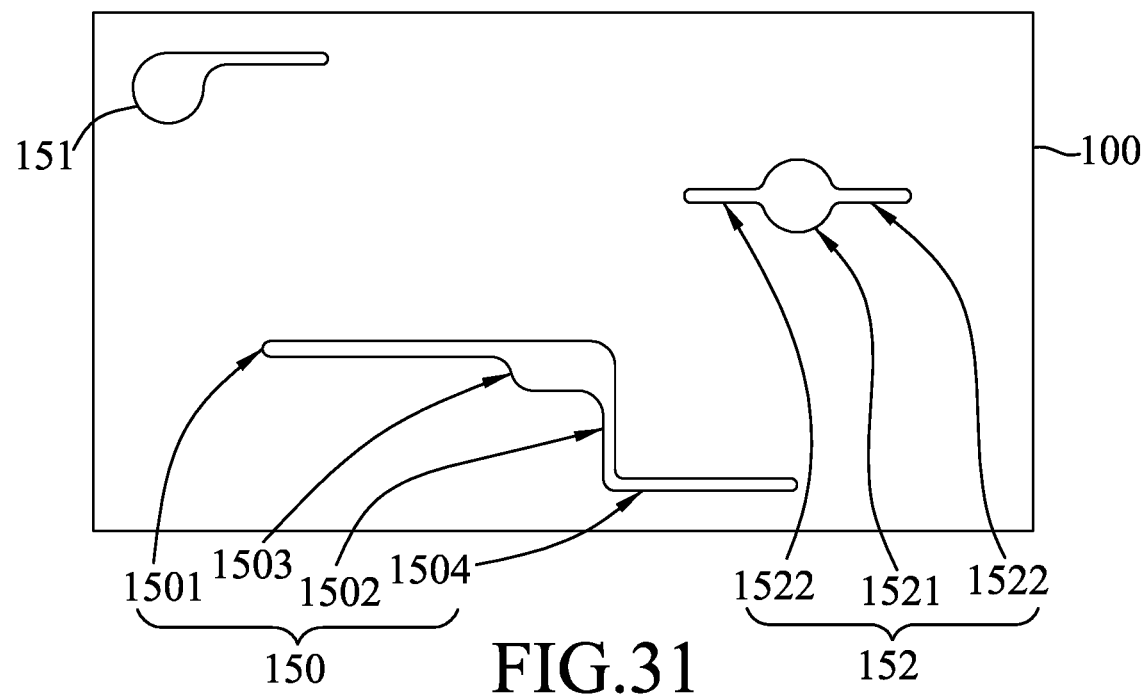
FIG. 31 is a top perspective projection view illustrating the at least one conductive bridging element, and the first and second conductive blocks of the sixth embodiment of the light-emitting device.
Figure 32:
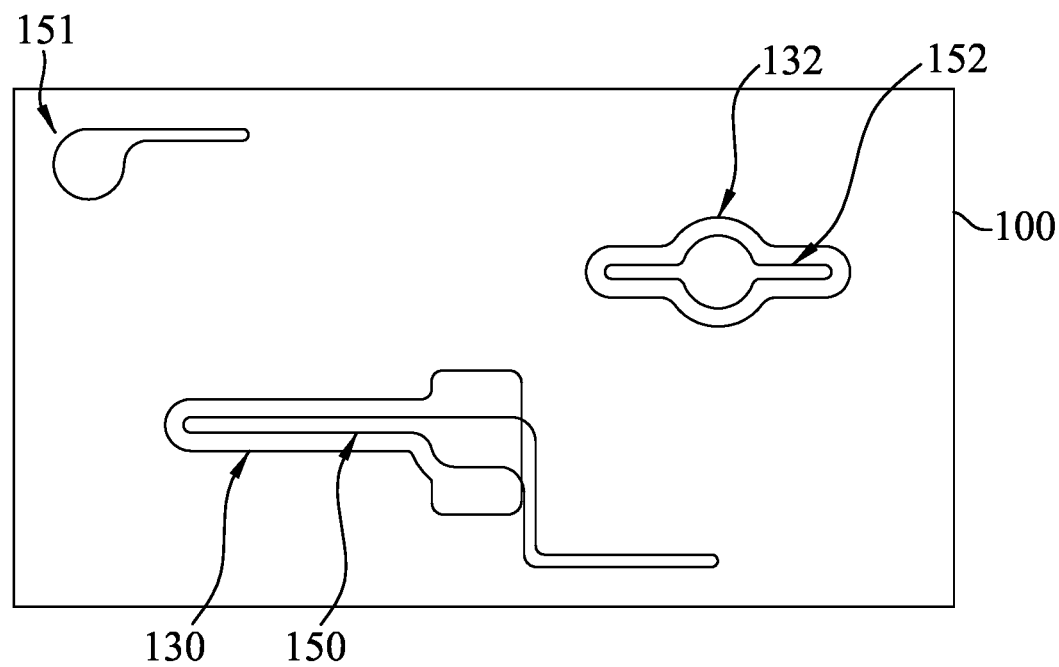
FIG. 32 is a top perspective projection view illustrating the at least one conductive bridging element, the at least one current blocking element, the first and second conductive blocks, and the current blocking structure of the sixth embodiment of the light-emitting device.

Referring to FIG. 22, a fourth embodiment of the light-emitting device is similar to the second embodiment of the light-emitting device, except that the second conductive block 152 has a projection image located within that of the second conductive pad 172 in the top view of the light-emitting device.

That is, the second conductive pad 172 has a boundary extending outside the projection image of the second conductive block 152 instead of intersecting with thereof, such that the second conductive pad 172 is smoothly disposed on the first distributed Bragg reflective layer. 160, thereby allowing the second conductive pad 172 to receive uniform force when subjected to external pushing or pulling forces. Thereby, peeling of the boundary of the second conductive pad 172, which often occurs in an area where the boundaries of the second conductive pad 172 and the second conductive block 152 intersects, is reduced.

In some embodiments, the boundaries of the second conductive pad 172 and the second conductive block 152 has a distance of at least 8 μm, which may further reduce probability of the boundary of the second conductive pad 172 being peeled off.

In some embodiments, although the current blocking structure 132 disposed beneath the second conductive block 152 is beneficial to light emitting, yet, in the case that a flexible chip carrier that is easily deformable is used in packaging, the current blocking structure 132 may be omitted from the light-emitting device for reducing the risk of breaking thereof caused by deformation of the chip carrier.

Embodiment 5

Referring to FIGS. 23 to 27, a fifth embodiment of the light-emitting device is similar to the first embodiment of the light-emitting device, except that the number of the conductive bridging element 150 and the current blocking element 130 of the light-emitting device is one. Thus, the conductive bridging element 150 and the current blocking element 130 are located at a bisecting line of the first and second mesa structures 111, 112.

The number and shape of the exposed portion 1121 of the first type semiconductor layer. 112k of the second mesa structure 112 are adjusted accordingly.

Further, the body portion 1503 of the conductive bridging element 150 and the tail portion 1302 of the current blocking element 130 are relatively larger than those of the first embodiment, which improves reliability of final products due to lower resistance.

In this embodiment, the head portion 1301 has a width W31 that is larger than a width W32 of the tail portion 1301.

Accordingly, the first portion 1501 of the conductive bridging element 150 has a width W51 which is larger than that of the body portion 1503. Besides, the second portion 1502 has a width W52 which is larger than that of the body portion 1503. That is, the first and second portions 1501, 1502 are relatively blunt with respect to the body portion 1503.

Similarly, the first width difference D1 is larger than the second width difference D2 to ensure conductive function of the conductive bridging element 150 and to avoid current leakage, thus increasing reliability of final products. Details regarding the first width difference D1 and the second width difference D2 are similar to those described above with reference to FIG. 7.

Embodiment 6

Referring to FIGS. 28 to 32, a sixth embodiment of the light-emitting device is similar to the third embodiment of the light-emitting device, except that the number of the conductive bridging element 150 and the current blocking element 130 of the light-emitting device is one. The conductive bridging element 150 and the current blocking element 130 are located in corresponding position proximate to a boundary of the light-emitting device.

Besides, the first conductive block 151 is located at a diagonal corner of the first mesa structure 112 with respect to the conductive bridging element 150 in the top view of the light-emitting device, which is beneficial to current spreading. In this embodiment, the first conductive block 151 is located at upper left corner of the first mesa structure 112.

In some embodiments, the light-emitting device may further include a third mesa structure that is similar in composition to that of the first mesa structure 111. The third mesa structure may be electrically connected in series to the second mesa structure 112 by an extra conductive bridging element and an extra current blocking element, detailed structure of which may be obtained by referring to any of the above-mentioned embodiments. In other embodiments, the light-emitting device may include a fourth mesa structure or even more.

The light-emitting device of the disclosure may be further packaged into a module, and serves as a light source in a light-emitting module of a backlight display.

In some embodiments, a light-emitting module in accordance with the disclosure includes the light-emitting device as described in any of the above-mentioned embodiments.

In some embodiments, a display apparatus in accordance with the disclosure includes a backlighting module and the light-emitting device as described in any of the above-mentioned embodiments, which serves as a light source of the backlighting module.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
a substrate;
first and second mesa structures that are separately disposed on said substrate with a groove formed therebetween, said groove having a bottom, each of said first and second mesa structures including
a first type semiconductor layer disposed on said substrate,
an active layer disposed on said first type semiconductor layer to expose a portion of said first type semiconductor layer, and
a second type semiconductor layer disposed on said active layer to expose the exposed portion of said first type semiconductor layer, said first type semiconductor layer, said active layer and said second type semiconductor layer cooperatively defining a side surface;
at least one current blocking element that is disposed on said second type semiconductor layer of said first mesa structure to expose a portion of said second type semiconductor layer of said first mesa structure, and that extends to said side surface of said first mesa structure, said bottom of said groove and a portion of said side surface of said second mesa structure defined by said first type semiconductor layer in a continuous manner;
at least one conductive bridging element that is disposed on said at least one current blocking element and that includes a body portion, a first portion extending from said body portion and electrically connected to said second type semiconductor layer of said first mesa structure, and a second portion extending from said body portion and electrically connected to said first type semiconductor layer of said second mesa structure;
a first conductive pad that is located in corresponding position above said first mesa structure and that is electrically connected to said first type semiconductor layer of said first mesa structure; and
a second conductive pad that is located in corresponding position above said second mesa structure and that is electrically connected to said second type semiconductor layer of said second mesa structure,
wherein, said at least one conductive bridging element has a projection image that is spaced apart from those of said first and second conductive pads in a plan view of said light-emitting device, and
wherein said light-emitting device includes two of said conductive bridging elements, the projection image of said first conductive pad having an intervening part located between the projection images of said two of said conductive bridging elements.

2. The light-emitting device of claim 1, wherein the projection image of said second conductive pad has an intervening part located between the projection images of said two of said conductive bridging elements.

3. The light-emitting device of claim 1, wherein said light-emitting device includes two of said current blocking elements, each of said conductive bridging elements being disposed on a corresponding one of said current blocking elements, said conductive bridging elements being respectively located in corresponding position proximate to two opposite boundaries of said light-emitting device.

4. The light-emitting device of claim 3, wherein each of said current blocking elements includes a head portion that is disposed on said second type semiconductor layer of said first mesa structure, and a tail portion that extends from said head portion to said side surface of said first mesa structure, said bottom of said groove and said portion of said side surface of said second mesa structure defined by said first type semiconductor layer.

5. The light-emitting device of claim 4, wherein, said tail portion has a width that is at least 1.5 times larger than that of said head portion.

6. The light-emitting device of claim 4, wherein said body portion of each of said conductive bridging elements is disposed on said tail portion of a corresponding one of said current blocking elements so as to extend across said groove, and has a projection image located within that of said tail portion in the plan view of said light-emitting device, said first portion of each of said conductive bridging elements being disposed on said head portion of said corresponding one of said current blocking elements, and having a projection image located within that of said head portion in the plan view of said light-emitting device, said second portion of each of said conductive bridging elements being disposed on said exposed portion of said first type semiconductor layer of said second mesa structure and having a projection image extending outside that of said corresponding one of said current blocking elements in the plan view of said light-emitting device.

7. The light-emitting device of claim 1, wherein said first portion of each of said conductive bridging elements has a width less than that of said body portion, said second portion of each of said conductive bridging elements having a width larger than that of said body portion.

8. The light-emitting device of claim 6, wherein said body portion and said tail portion have a first width difference therebetween, said first portion and said head portion having a second width difference therebetween, the first width difference being larger than the second width difference.

9. The light-emitting device of claim 8, wherein the first width difference ranges from 6 μm to 200 μm.

10. The light-emitting device of claim 8, wherein the second width difference ranges from 0 μm to 60 μm.

11. The light-emitting device of claim 1, wherein each of said conductive bridging elements further includes a third portion that extends from said second portion and that is disposed on said exposed portion of said first type semiconductor layer of said second mesa structure, said third portion having a width less than that of said body portion.

12. The light-emitting device of claim 11, wherein each of said first, third and body portions of each of said conductive bridging elements defines a bisecting line that geometrically divides each of said first, third and body portions into two symmetrical halves in the plan view of said light-emitting device, the bisecting lines of said first portion and said body portion coinciding with each other in a first line, the bisecting line of said third portion being parallel to the first line.

13. The light-emitting device of claim 1, wherein said exposed portion of said first type semiconductor layer of said second mesa structure has a shape corresponding to a shape of said second portion of each of said conductive bridging elements, is adjacent to said first mesa structure, and is located in position corresponding to each of said conductive bridging elements.

14. The light-emitting device of claim 1, further comprising a first conductive block disposed on said exposed portion of said first type semiconductor layer of said first mesa structure.

15. The light-emitting device of claim 14, wherein said exposed portion of said first type semiconductor layer of said first mesa structure has a shape corresponding to a shape of said first conductive block, said first conductive block being in a form of circle or round head nail in the plan view of said light-emitting device.

16. The light-emitting device of claim 1, further comprising a second distributed Bragg reflective layer disposed on a backside of said substrate opposite to said first and second mesa structures.

17. A light-emitting module, comprising:
said light-emitting device as claimed in claim 1.

18. A display apparatus, comprising:
a backlighting module; and
said light-emitting device as claimed in claim 1, serving as a light source of said backlighting module.

* * * * *